United States Patent
Fukami et al.

(10) Patent No.: US 8,791,534 B2
(45) Date of Patent: Jul. 29, 2014

(54) MAGNETIC MEMORY DEVICE AND MAGNETIC MEMORY

(75) Inventors: Shunsuke Fukami, Tokyo (JP);
Tetsuhiro Suzuki, Tokyo (JP);
Kiyokazu Nagahara, Tokyo (JP);
Nobuyuki Ishiwata, Tokyo (JP);
Norikazu Ohshima, Tokyo (JP)

(73) Assignee: NEC Corporation, Tokyo (JP)

( * ) Notice: Subject to any disclaimer, the term of this patent is extended or adjusted under 35 U.S.C. 154(b) by 28 days.

(21) Appl. No.: 13/806,828

(22) PCT Filed: Jun. 16, 2011

(86) PCT No.: PCT/JP2011/063779
§ 371 (c)(1),
(2), (4) Date: Feb. 8, 2013

(87) PCT Pub. No.: WO2012/002156
PCT Pub. Date: Jan. 5, 2012

(65) Prior Publication Data
US 2013/0140660 A1 Jun. 6, 2013

(30) Foreign Application Priority Data

Jun. 29, 2010 (JP) ................................. 2010-148138

(51) Int. Cl.
*H01L 43/00* (2006.01)
(52) U.S. Cl.
USPC ............ 257/421; 257/E43.004; 257/E29.323; 360/324.11; 360/324.12; 365/158; 365/171
(58) Field of Classification Search
USPC .......................... 257/421, E43.004, E29.323; 360/324.11, 324.12; 365/158, 171, 173
See application file for complete search history.

(56) References Cited

U.S. PATENT DOCUMENTS

| 7,599,156 B2 * | 10/2009 | Kishi et al. ............... 360/324.11 |
| 2004/0264064 A1 * | 12/2004 | Sakakima ..................... 360/322 |

(Continued)

FOREIGN PATENT DOCUMENTS

| JP | 2005-191032 A | 7/2005 |
| JP | 2008-147488 A | 6/2008 |

(Continued)

OTHER PUBLICATIONS

International Search Report (ISR) (PCT Form PCT/ISA/210) dated Sep. 6, 2011, in PCT/JP2011/063779.

(Continued)

*Primary Examiner* — Matthew E Warren
(74) *Attorney, Agent, or Firm* — McGinn IP Law Group, PLLC

(57) ABSTRACT

In a perpendicular magnetization domain wall motion MRAM in which the magnetizations of both ends of a magnetization free layer are pinned by magnetization pinned layers, the increase of a write current due to leakage magnetic field from the magnetization pinned layer is prevented. A first displacement is present between a first boundary line and a first vertical line, where a curve portion, which crosses a first magnetization free layer, of an outer circumferential line of a first magnetization pinned layer is the first boundary line, a segment which links a center of a magnetization free region and a center of a first magnetization pinned region is a first segment, and a segment, which is a vertical line of the first segment, and which comes in contact with the first boundary line is the first vertical line.

14 Claims, 20 Drawing Sheets

(56) References Cited

U.S. PATENT DOCUMENTS

| | | | |
|---|---|---|---|
| 2006/0139818 A1* | 6/2006 | Inaba et al. | 360/324.12 |
| 2010/0188890 A1 | 7/2010 | Fukami et al. | |
| 2011/0129691 A1 | 6/2011 | Ishiwata et al. | |

FOREIGN PATENT DOCUMENTS

| | | |
|---|---|---|
| WO | WO 2009/001706 A1 | 12/2008 |
| WO | WO 2009/019948 A1 | 2/2009 |
| WO | WO 2009/101827 A1 | 8/2009 |

OTHER PUBLICATIONS

Written Opinion of the ISA issued in International Application No. PCT/JP2011/063779 on Sep. 6, 2011.

Fukami, et al., "Micromagnetic analysis of current driven domain wall motion in nanostrips with perpendicular magnetic anisotropy", Journal of Applied Physics, vol. 103, p. 07E718, (2008).

Sakimura, et al., "MRAM Cell Technology for Over 500-MHz SoC", IEEE Journal of Solid-State Circuits, vol. 42, No. 4, Apr. 2007, p. 830 (2007).

Koyama, et al., "Control of Domain Wall Position by Electrical Current in Structured Co/Ni Wire with Perpendicular Magnetic Anisotropy", Applied Physics Express, vol. 1, p. 101303, (2008).

Yamaguchi, et al., "Real-Space Observation of Current-Driven Domain Wall Motion in Submicron Magnetic Wires", Physical Review Letters, vol. 92, p. 077205 (2004).

PCT/ISA/237 (English translation dated Feb. 12, 2013, of written opinion of the international searching authority, dated Sep. 6, 2011, in International Application No. PCT/JP2011/063779).

PCT/IB/373.

* cited by examiner

MAGNETIC MEMORY DEVICE AND MAGNETIC MEMORY

TECHNICAL FIELD

The present invention relates to a magnetic memory device, a magnetic memory and a method of manufacturing it. More particular, the present invention relates to a magnetic memory device and a magnetic memory, each of which uses a magnetic domain wall motion and is formed of a material having a perpendicular magnetic anisotropy, and a method of manufacturing it.

BACKGROUND ART

A magnetic memory or magnetic random access memory (MRAM) is a non-volatile memory in which a high speed operation and the infinite number of times of rewrite operations can be carried out. Already, its practical use is partially started. Also, a development for improving versatility is advanced. In the MRAM, a magnetic material is used as a storing element, and a datum is stored in correspondence to the orientation of the magnetization of the magnetic material. As a method of switching the orientation of the magnetization of the magnetic material, several methods are proposed, and they are common in the use of a current. How much the write current can be reduced is very important for practical use of a MRAM. According to Non-Patent Literature 1, the reduction to 0.5 mA or less is required, and further preferably, the reduction to 0.2 mA or less is required. This is because the minimum layout can be attained in a 2T-1MTJ (two transistors—one magnetic tunnel junction) circuit proposed in the Non-Patent Literature 1, when the write current can be reduced to about 0.2 mA, and a cost performance equivalent to existing volatile memories such as DRAM and SRAM can be attained.

The most typical method among methods of writing data into the MRAM, is a method of arranging interconnections for a write operation around a magnetic memory device and switching the direction of the magnetization of the magnetic memory device by a magnetic field generated by supplying current to the interconnections. In this method, the direction of the magnetization is inverted by the magnetic field. Thus, in principle, the write operation can be attained in 1 nanosecond or less, which is preferable for attaining the high speed MRAM. However, the magnetic field for switching the direction of the magnetization of the magnetic material in which thermal stability and disturbance magnetic field durability are reserved becomes about several 10 Oe (oersted). Therefore, the current of several mA is required to generate such magnetic field. In this case, a chip area has to be large, and a consumed power amount required for a write operation also increases. Therefore, this random access memory is inferior to other random access memories in the competitiveness. In addition to this, when the element has a miniaturized shape, the write current is further increased, which is not preferable from the viewpoint of scaling.

In recent years, as means for solving such problems, the following two methods are proposed. The first method uses a spin injection magnetization inversion. In this method, a stacked film is formed by a first magnetic layer (magnetization free layer) having an invertible magnetization; and a second magnetic layer (reference layer) which is electrically connected to the first magnetic layer and whose magnetization is fixed; and the magnetization of the first magnetic layer (magnetization free layer) is inverted by using a mutual action between conductive electrons spin-polarized when current is passed between the second magnetic layer (reference layer) and the first magnetic layer (magnetization free layer), and local electrons in the first magnetic layer (magnetization free layer). At a time of read, a magnetic resistance effect is used between the first magnetic layer (magnetization free layer) and the second magnetic layer (reference layer). Thus, the MRAM that uses the spin injection magnetization inversion method is an element of two terminals.

The spin injection magnetization inversion occurs at a time of a certain current density or more. Thus, when the size of the element is small, the current for write is reduced. That is, the spin injection magnetization inversion method is superior in scaling property. However, an insulating layer is typically provided between the first magnetic layer (magnetization free layer) and the second magnetic layer (reference layer), and at the time of write, a relatively large current must be supplied to the insulating layer. Thus, this results in problems of rewrite durability and reliability. Also, since a current path for the write operation and a current path for the read operation are same, an erroneous write operation is made anxious at the time of read. In this way, although the spin injection magnetization inversion is superior in the scaling property, several bars exist against a practical use.

On the other hand, the second method, namely, a magnetization inversion method that uses a current driven magnetic domain wall motion phenomenon can solve the above problems existing in the spin injection magnetization inversion. The MRAM that uses the current driven magnetic domain wall motion phenomenon is disclosed in, for example, Patent Literature 1. In the MRAM using the current driven magnetic domain wall motion phenomenon, the magnetizations at both ends of the first magnetic layer (magnetization free layer) that typically has the invertible magnetization are fixed so as to be substantially anti-parallel to each other. At a time of the foregoing magnetization arrangement, a magnetic domain wall is introduced into the first magnetic layer. Here, as reported in a Non-Patent Literature 2, when a current is supplied to a direction passing through the magnetic domain wall, the magnetic domain wall is moved to the direction of a flow of the conductive electrons. Thus, it is possible to write by supplying the current into the first magnetic layer (magnetization free layer).

At a time of reading data, a magnetic tunnel junction (MTJ) provided in a region in which the magnetic domain wall is moved is used to carry out the read operation through the magnetic resistance effect. Thus, the MRAM using the current driven magnetic domain wall motion method serves as an element of three terminals and also matches with the 2T-1MTJ configuration proposed in the above Non-Patent Literature 1. Since the current driven magnetic domain wall motion occurs at a time of a certain current density or more, this has the scaling property similarly to the spin injection magnetization inversion. In addition to this, in the MRAM element that uses the current driven magnetic domain wall motion, the write current does not flow through the insulating layer inside the magnetic tunnel junction, and the path of the write current and the path of the read current are different. For this reason, the above problems in the spin injection magnetization inversion are solved.

Also, in the Non-Patent Literature 2, about $1 \times 10^{18}$ [A/cm$^2$] is required as a current density necessary for a current driven magnetic domain wall motion. In this case, for example, when a width of the layer (magnetization free layer) in which the magnetic domain wall motion occurs is assumed to be 100 nm and a film thickness is assumed to be 10 nm, a write current becomes 1 mA. This can not satisfy a condition of the above write current. On the other hand, as described in a Non-Patent Literature 3, the write current can be reduced to a sufficiently small value, by using a material having a perpendicular magnetic anisotropy for a ferromagnetic layer (magnetization free layer) in which the current driven magnetic domain wall motion occurs. In view of the above, when the current driven magnetic domain wall motion is used to manufacture a MRAM, it is preferable to use the ferromagnetic material having the perpendicular magnetic anisotropy as the layer (magnetization free layer) in which the magnetic domain wall motion occurs.

CITATION LIST

[Patent Literature 1]: JP 2005-191032A
[Patent Literature 2]: WO 2009/001706
[Non-Patent Literature 1]: IEEE Journal of Solid-State Circuits, vol. 42, p. 830 (2007)
[Non-Patent Literature 2]: Physical Review Letters, vol. 92, p. 077205 (2004)
[Non-Patent Literature 3]: Journal of Applied Physics, vol. 103, p. 07E718, (2008)
[Non-Patent Literature 4]: Applied Physics Express, vol. 1, p. 101303, (2008)

SUMMARY OF THE INVENTION

In Patent Literature 2, a structure is proposed in which a magnetization pinned layers having magnetizations anti-parallel to each other are provided for both ends of a magnetization free layer, in MRAM (domain wall motion MRAM) using current driven domain wall motion for a writing method. By the above structure, the magnetizations at both ends of the layer (the magnetization free layer) in which the above-mentioned domain wall motion occurs are fixed in the anti-parallel directions, and a single domain wall is introduced.

In the structure of Patent Literature 2, the domain wall is excessively strongly pinned by leak magnetic field from the magnetization pinned layer and the write in a small current becomes difficult, when the saturation magnetization (Ms) of the magnetization pinned layer is great and a film thickness (t) is thick.

A first object of the present invention is to provide a perpendicular magnetization domain wall motion MRAM which can prevent the increase of the write current due to leak magnetic field from the magnetization pinned layer and can realize the write in a small current, in the structure in which the magnetizations of both ends of the magnetization free layer are pinned by magnetization pinned layers, as proposed in Patent Literature 2.

In the view of the present invention, the magnetic memory device includes a first magnetization free layer, a non-magnetic layer, a reference layer and a magnetization pinned layer. The first magnetization free layer includes a ferromagnetic material having perpendicular magnetic anisotropy, and a first magnetization free layer includes a first magnetization pinned region, a second magnetization pinned region and a magnetization free region. The magnetization pinned layer includes the first magnetization pinned layer magnetically coupled with the first magnetization pinned region at least. A first displacement is present between a first boundary line and a first vertical line, where a curve portion, which crosses the first magnetization free layer, of an outer circumferential line of the first magnetization pinned layer is the first boundary line, a segment which links a center of the magnetization free region and a center of the first magnetization pinned region is a first segment, and a segment, which is a vertical line of the first segment, and which comes in contact with the first boundary line is the first vertical line.

According to the present invention, it is possible to provide a structure of a perpendicular magnetization domain wall motion MRAM which can prevent the increase of a write current due to leak magnetic field from a magnetization pinned layer and can realize a write operation in a small current.

BRIEF DESCRIPTION OF THE DRAWINGS

The above object, other objects, advantages, and features of the present invention would become clear from the description of embodiments in conjunction with the attached drawings.

DESCRIPTION OF EXEMPLARY EMBODIMENTS

Hereinafter, a magnetic memory device, a magnetic memory and a method of manufacturing them according to the exemplary embodiments of the present invention will be described with reference to the attached drawings. The magnetic memory according to the present exemplary embodiment has a plurality of magnetic memory cells arranged in the shape of an array, and each of the magnetic memory cells has the magnetic memory device. The present exemplary embodiment relates to the magnetic memory device, the structure of the magnetic memory, and the method of manufacturing them.

(Structure)

Figure 1A:
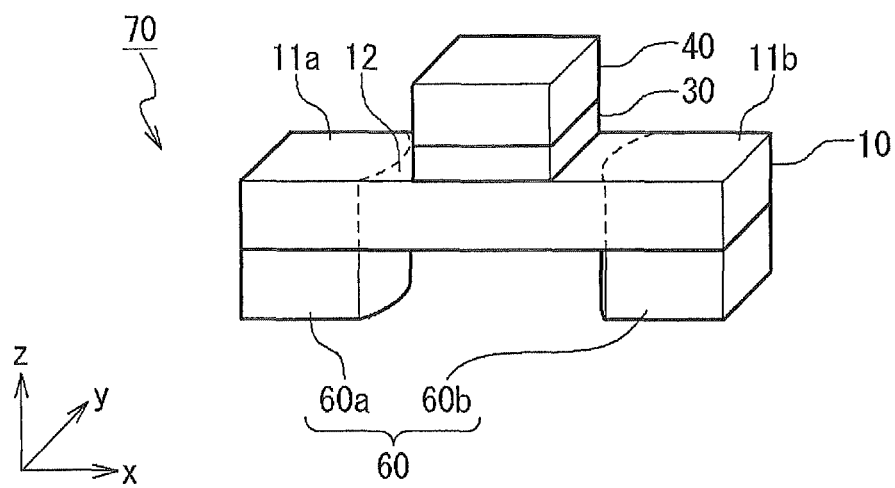
FIG. 1A shows a structure of a magnetic memory device.
Figure 1B:
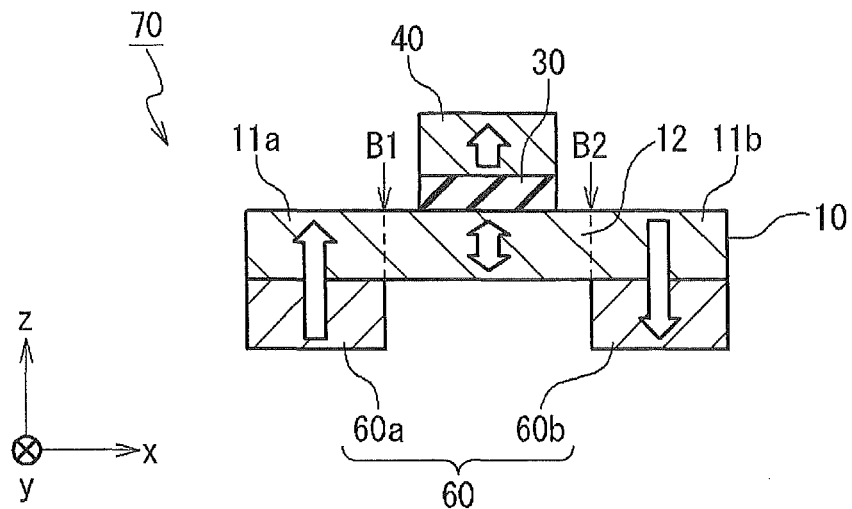
FIG. 1B shows a structure of the magnetic memory device.
Figure 1C:
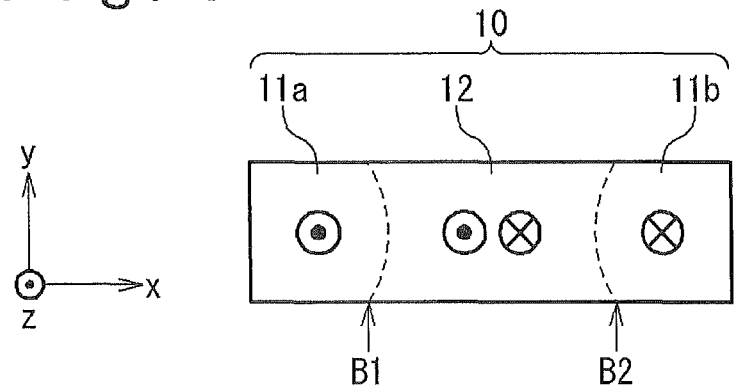
FIG. 1C shows a structure of the magnetic memory device.
Figure 1D:
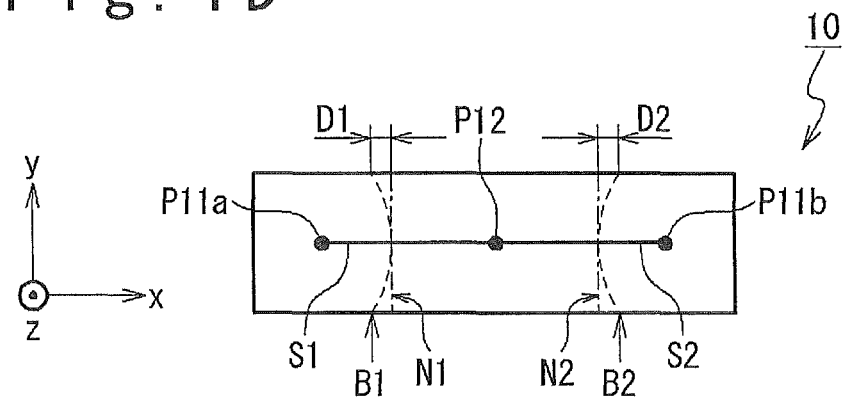
FIG. 1D shows a structure of the magnetic memory device.

FIGS. 1A to 1D are diagrams showing the typical structure of a main portion of a magnetic memory device 70 according to the present exemplary embodiment. FIG. 1A shows a perspective view, and FIG. 1B shows an x-z sectional view. FIGS. 1C and 1D show x-y plan views of a first magnetization free layer 10 of the magnetic memory device 70. It should be noted that in an x-y-z coordinate system shown FIGS. 1A to 1D, a z-axis is assumed to indicate a direction vertical to a substrate, and a y-axis is assumed to be parallel to a surface of the substrate.

The magnetic memory device 70 according to the present exemplary embodiment at least contains a first magnetization free layer 10, a non-magnetic layer 30, a reference layer 40 and a magnetization pinned layer 60. The first magnetization free layer 10, the reference layer 40 and the magnetization pinned layer 60 are made of ferromagnetic materials. In FIGS. 1B and 1C, the examples of the directions of the magnetizations of the respective magnetic layers are indicated by arrows.

FIG. 1C is the plan view showing the structure of the first magnetization free layer 10. The first magnetization free layer 10 is provided with three regions of a first magnetization pinned region 11a, a second magnetization pinned region 11b and a magnetization free region 12. Each of the first magnetization pinned region 11a and the second magnetization pinned region 11b has the magnetization substantially fixed to one direction. Also, the magnetizations of the first magnetization pinned region 11a and the second magnetization pinned region 11b are fixed to the directions anti-parallel to each other. FIG. 1C shows that the first magnetization pinned region 11a and the second magnetization pinned region 11b are assumed to be fixed to a +z direction and a −z direction, respectively. It is possible to invert the magnetization of the magnetization free region 12. In this case, the magnetization can be oriented to one direction of the +z and the −z.

When the three regions in the first magnetization free layer 10 have the magnetization structures as mentioned above, a magnetic domain wall is generated in any one of a boundary between the first magnetization pinned region 11a and the magnetization free region 12 and a boundary between the second magnetization pinned region 11b and the magnetization free region 12 on the basis of the magnetization direction of the magnetization free region 12. In case of FIG. 1C, when the magnetization direction of the magnetization free region 12 is the +z direction, the magnetic domain wall is generated in the boundary between the second magnetization pinned region 11b and the magnetization free region 12, and when the magnetization direction of the magnetization free region 12 is the -z direction, the magnetic domain wall is generated in the boundary between the first magnetization pinned region 11a and the magnetization free region 12. Also, in an example shown in FIGS. 1A to 1D, the first magnetization pinned region 11a is adjacent to one end of the magnetization free region 12, and the second magnetization pinned region 11b is adjacent to the other end of the magnetization free region 12. Specifically, in the example of FIG. 1C, the first magnetization pinned region 11a is adjacent to the end of a −x direction side of the magnetization free region 12, and the second magnetization pinned region 11b is adjacent to the end of a +x direction side of the magnetization free region 12. However, typically, the first magnetization pinned region 11a and the second magnetization pinned region 11b may be connected to the magnetization free region 12, and a positional relation between them is arbitrary. For example, the first magnetization pinned region 11a may be connected to one end of the magnetization free region 12, and the second magnetization pinned region 11b may be also connected to the above one end of the magnetization free region 12. In this case, the first magnetization free layer 10 is structured to have the junction of three streets. Also, in the example shown in FIGS. 1A to 1D, the first magnetization free layer 10, the non-magnetic layer 30 and the reference layer 40 are stacked in this order. The reference layer 40 is made of a ferromagnetic material. Also, the non-magnetic layer 30 is made of a non-magnetic material and preferably made of an insulating material. At this time, the magnetic tunnel junction (MTJ) is generated by the three layers of the first magnetization free layer 10, the non-magnetic layer 30 and the reference layer 40. The non-magnetic layer 30 and the reference layer 40, which is connected through the non-magnetic layer 30 to the first magnetization free layer 10, are connected to the magnetization free region 12 in the first magnetization free layer 10. Also, the shapes of the non-magnetic layer 30 and the reference layer 40 are arbitrary.

In the example shown in FIGS. 1A to 1D, the reference layer 40 is preferably made of the ferromagnetic material having the perpendicular magnetic anisotropy and has the magnetization that is substantially fixed to one direction. In the example of FIG. 1B, the magnetization of the reference layer 40 is fixed to the +z direction. Also, although this is not shown, the reference layer 40 may have the following stack structure. For example, the reference layer 40 may have the structure in which the three layers of a ferromagnetic material, a non-magnetic material and a ferromagnetic material are stacked in this order. Here, the non-magnetic material sandwiched between the two ferromagnetic materials preferably has a function of magnetically coupling (coupling in a stacked ferry manner) the upper and lower ferromagnetic materials in anti-parallel directions. As the non-magnetic material having the foregoing function, Ru (ruthenium) is known. Since the reference layer 40 is designed as the stack structure having the stacked ferry coupling, a leakage magnetic field to the outside can be reduced, thereby reducing the magnetic influence on the other layers such as the first magnetization free layer 10. In addition to this, the anti-ferromagnetic material may be adjacent to the reference layer. This is because the magnetization direction of a surface boundary can be fixed to one direction by arranging the adjacent anti-ferromagnetic material and performing a thermal treatment in the magnetic field. As the typical anti-ferromagnetic materials, Pt—Mn, Ir—Mn and the like are exemplified.

The magnetization pinned layer 60 has a first magnetization pinned layer 60a at least. In the example shown in FIGS. 1A to 1D, the magnetization pinned layer 60 is composed of the first magnetization pinned layer 60a and a second magnetization pinned layer 60b. The first magnetization pinned layer 60a is provided to be magnetically connected to the first magnetization pinned region 11a. Also, the second magnetization pinned layer 60b is provided to be magnetically connected to the second magnetization pinned region 11b. It should be noted that the above-mentioned [magnetic connection] implies that they apply the magnetically mutual action to each other. Thus, they are not required to be adjacent, and they are not required to be electrically connected.

The magnetization pinned layer 60 has a role of orienting the directions of the magnetizations of the first magnetization pinned region 11a and the second magnetization pinned region 11b to the anti-parallel direction as mentioned above, and further fixing them to the directions. Thus, in the example shown in FIGS. 1A to 1D, in the first magnetization free layer 10, the region overlapping with the first magnetization pinned layer 60a serves as the first magnetization pinned region 11a, and the region overlapping with the second magnetization pinned layer 60b serves as the second magnetization pinned region 11b. The region other than them serves as the magnetization free region 12. Here, a boundary line between the first magnetization pinned region 11a and the magnetization free region 12 is defined as a first boundary line B1, and a boundary line between the second magnetization pinned region 11b and the magnetization free region 12 is defined as a second boundary line B2. Thus, the first boundary line B1 is defined as a curve of a portion, which intersects the first magnetization free layer 10 in the x-y plane, of an outer circumferential line of the first magnetization pinned layer 60a. Similarly, the second boundary line B2 is defined as a curve of a portion, which intersects the first magnetization free layer 10 in the x-y plane, of an outer circumferential line of the second magnetization pinned layer 60b.

The features of the present exemplary embodiment will be described below. The features of the present exemplary embodiment are in the shapes of the first boundary line B1 and the second boundary line B2. The main part will be described below with reference to FIG. 1D. Here, the centers of the first magnetization pinned region 11a, the second magnetization pinned region 11b and the magnetization free region 12 in the x-y plane are defined as a point P11a, a point P11b and a point P12, respectively. Also, a segment to connect the point P11a and the point P12 is defined as a first segment S1, and a segment to connect the point P11b and the point P12 is defined as a second segment S2. Also, a straight line, which serves as a vertical line of the first segment 81 and contacts with the first boundary line B1, is defined as a first vertical line N1, and a straight line, which serves as a vertical line of the second segment S2 and contacts with the second boundary line B2, is defined as a second vertical line N2. At this time, in the present exemplary embodiment, the first boundary line B1 has a first displacement D1 to the first vertical line N1 at least. It should be noted that as shown in FIGS. 1A to 1D, when the magnetization pinned layer 60 is configured to contain the first magnetization pinned layer 60a and the second magnetization pinned layer 60b, the first boundary line B1 preferably has the first displacement D1 to the first line N1, and the second boundary line B2 preferably has a second displacement D2 to the second line N2.

It should be noted that preferably, the values of the first displacement D1 and the second displacement D2 are approximately equal to or more than a magnetic domain wall width of the magnetic domain wall that is generated in the first magnetization free layer 10. Here, the magnetic domain wall width has a value that is determined by a magnetic anisotropy constant Ku and an exchange stiffness constant A of the ferromagnetic material used for the first magnetization free layer 10. In case of the ferromagnetic material having the typical perpendicular magnetic anisotropy, the magnetic domain wall width is between about 5 and 20 nm. Thus, it is preferable that the values of the first displacement D1 and the second displacement D2 are 5 nm or more.

Also, although this is not shown in FIGS. 1A to 1D, the first magnetization pinned region 11a and the second magnetization pinned region 11b are connected to different external wirings, respectively, and the reference layer 40 is connected to a different external wiring. That is, the magnetic memory device 70 serves as an element of three terminals. It should be noted that different layers may be inserted into the paths of the first magnetization pinned region 11a, the second magnetization pinned region 11b and the external wirings, and the path of the reference layer 40 and the external wiring. For example, the first magnetization pinned region 11a and the first magnetization pinned layer 60a may be electrically connected, and the first magnetization pinned layer 60a may be connected to the external wiring. On the other hand, the second magnetization pinned region 11b and the second magnetization pinned layer 60b may be electrically connected, and the second magnetization pinned layer 60b may be connected to the different external wiring.

(Memory State)

The memory state of the magnetic memory device according to the present exemplary embodiment will be described below.

Figure 2A:
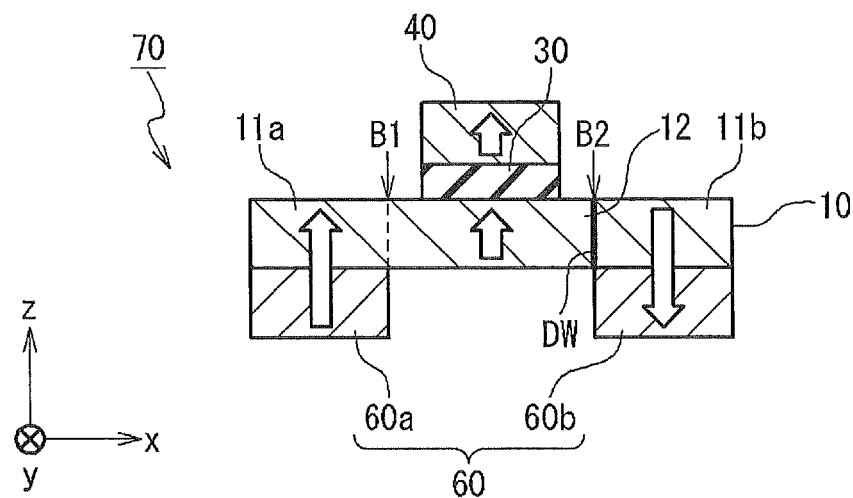
FIG. 2A shows a memory state.
Figure 2B:
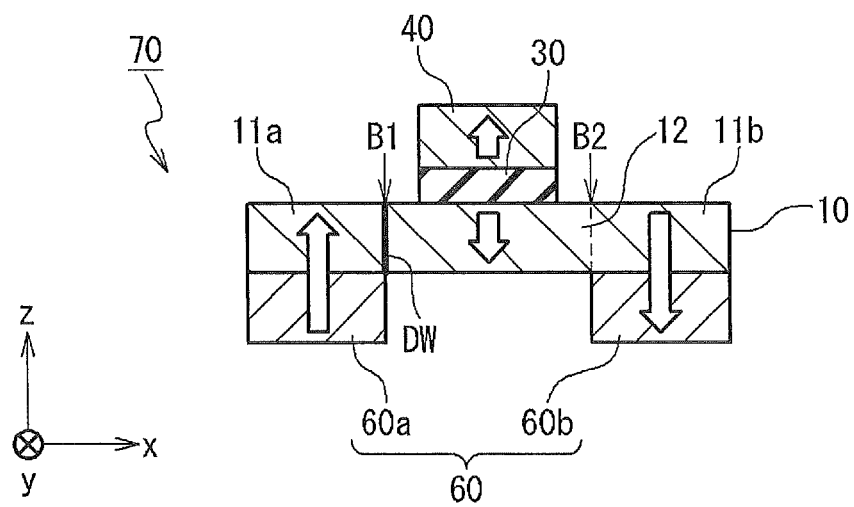
FIG. 2B shows a memory state.
Figure 2C:
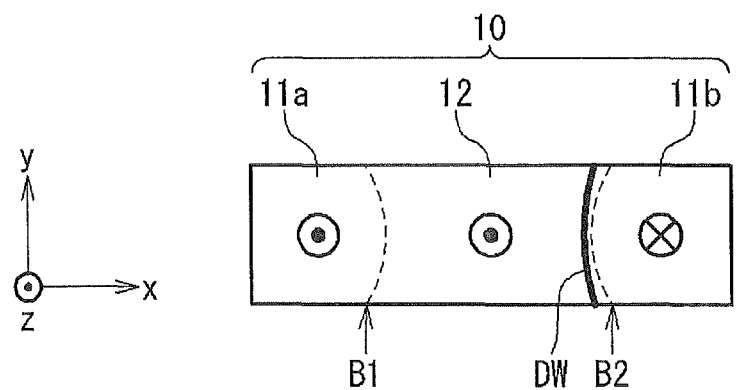
FIG. 2C shows a memory state.
Figure 2D:
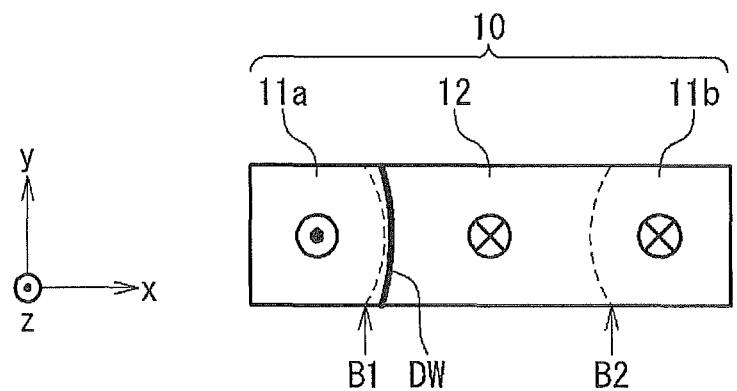
FIG. 2D shows a memory state.

FIGS. 2A and 2B show examples of the states of the magnetizations in the respective memory states of "0" and "1" of the magnetic memory device 70 according to the present exemplary embodiment. FIG. 2A shows the state of the magnetization in the "0" state, and FIG. 2B shows the state of the magnetization in the "1" state. It should be noted that here, the magnetization of the first magnetization pinned region 11a is assumed to be fixed to the +z direction, and the magnetization of the second magnetization pinned region 11b is assumed to be fixed to the −z direction.

Here, in the "0" state shown in FIG. 2A, the magnetization of the magnetization free region 12 has a +z direction component. At this time, a magnetic domain wall DW is generated on the boundary of the second magnetization pinned region 11b. On the other hand, in the "1" state shown in FIG. 2B, the magnetization of the magnetization free region 12 has a −z direction component. At this time, the magnetic domain wall DW is generated on the boundary of the first magnetization pinned region 11a.

In FIGS. 2A and 2B, the magnetization of the reference layer 40 is shown under an assumption that it is fixed to the +z direction. At this time, in the "0" state shown in FIG. 2A and the "1" state shown in FIG. 2B, the magnetization arrangements of the MTJ of the first magnetization free layer 10, the non-magnetic layer 30 and the reference layer 40 become parallel and anti-parallel, respectively. Thus, when a current is supplied to the MTJ, a low resistance and a high resistance are realized. It should be noted that the correspondences between the magnetization states and the memory states ("0" and "1"), which are defined in FIGS. 2A and 2B, are arbitrary. Thus, the correspondence is not evidently limited to them.

(Initializing Method)

An initialing method of the memory state of the magnetic memory device 70 according to the present exemplary embodiment will be described below. It should be noted that the initialization noted in this case implies a process in which the magnetizations of the first magnetization pinned region 11a and the second magnetization pinned region 11b become anti-parallel to each other and a single magnetic domain wall is introduced into the first magnetization free layer 10.

Figure 3A:
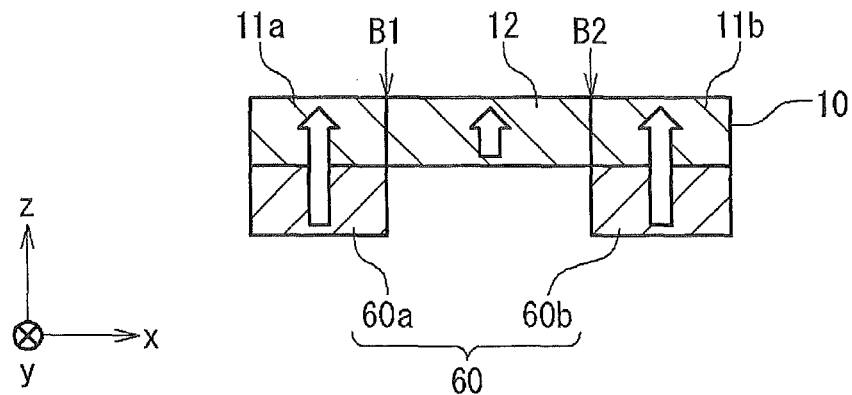
FIG. 3A shows an initialing method.
Figure 3B:
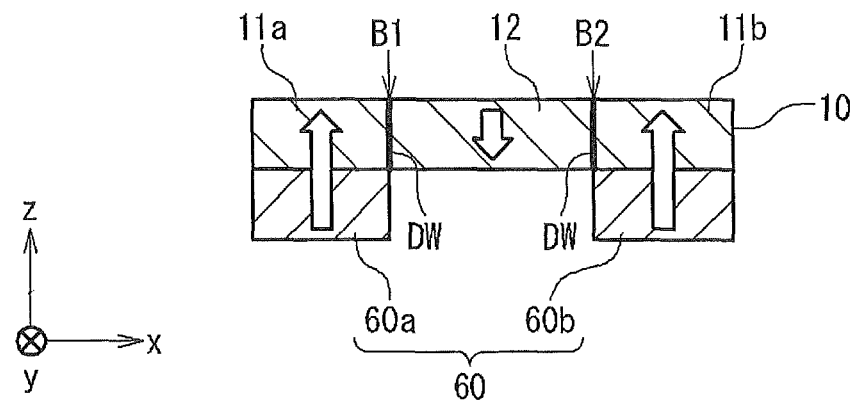
FIG. 3B shows the initialing method.
Figure 3C:
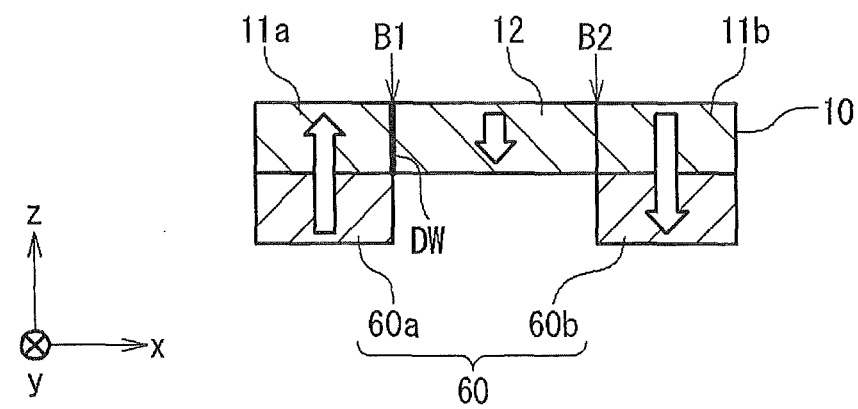
FIG. 3C shows the initialing method.

FIGS. 3A to 3C show an example of the initialing method of the memory state of the magnetic memory device 70 according to the present exemplary embodiment. It should be noted that in FIGS. 3A to 3C, the layers other than the first magnetization free layer 10 and the magnetization pinned layer 60 are omitted for the purpose of simplification. In FIGS. 3A to 3C, the magnetization pinned layer 60 is assumed to be composed of the first magnetization pinned layer 60a and the second magnetization pinned layer 60b. Also, the first magnetization pinned layer 60a is assumed to be hard as compared with the second magnetization pinned layer 60b.

In the example of the initialing methods shown in FIGS. 3A to 3C, the memory state is initialized by applying an external magnetic field on the basis of the following steps. At first, the sufficiently great external magnetic field is applied in the +z direction. At this time, as shown in FIG. 3A, the magnetizations of all of the regions are oriented to the +z direction. Next, the relatively small external magnetic field is applied to the −z direction. At this time, as shown in FIG. 3B, the magnetization of the magnetization free region 12 is firstly inverted and oriented to the −z direction. In succession, the external magnetic field in the −z direction is made slightly strong. At this time, as shown in FIG. 3C, the second magnetization pinned region 11b and the second magnetization pinned layer 60b are inverted and oriented to the -z direction. The state shown in FIG. 3C is the state in which the magnetic domain wall is trapped on the boundary between the first magnetization pinned region 11a and the magnetization free region 12, namely, a step difference S1. This coincides with the "1" state in FIG. 2B. The memory state of the magnetic memory device 70 can be initialized by applying the external magnetic field as mentioned above.

(Writing Method)

Figure 4A:
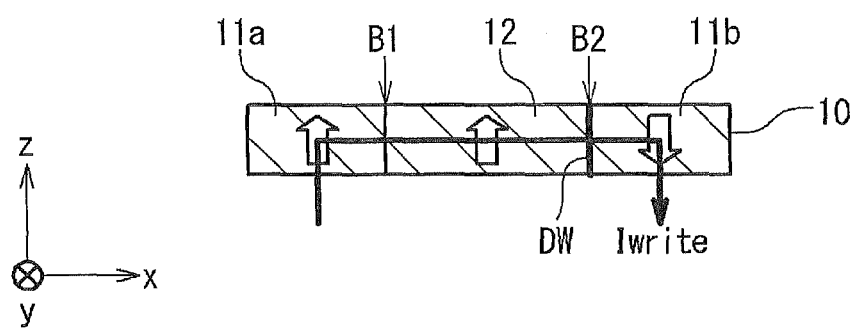
FIG. 4A shows a writing method.
Figure 4B:
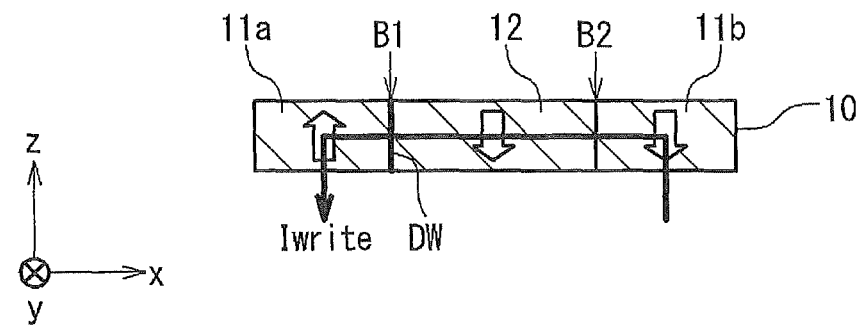
FIG. 4B shows the writing method.

The writing method of the data to the magnetic memory device 70 according to the present exemplary embodiment will be described below. FIGS. 4A and 4B show the writing method of the data to the magnetic memory device 70 according to the present exemplary embodiment. It should be noted that in FIGS. 4A and 4B, the illustration of the layers other than the first magnetization free layer 10 is omitted for the purpose of simplification. Here, in the "0" state defined in FIG. 2A, a current is introduced in a direction indicated by an arrow Iwrite in FIG. 4A. At this time, in the first magnetization free layer 10, conduction electrons are supplied from the second magnetization pinned region 11b through the magnetization free region 12 to the first magnetization pinned region 11a. At this time, a spin transfer torque (STT) acts against the magnetic domain wall DW formed on the boundary between the second magnetization pinned region 11b and the magnetization free region 12, and the conduction electrons are moved to a negative direction of an x-axis. That is, the current driven magnetic domain wall motion phenomenon is induced. Here, the write current is decreased in the negative direction of the x-axis, as compared with the boundary between the first magnetization pinned region 11a and the magnetization free region 12. Thus, the magnetic domain wall DW is stopped in the boundary between the first magnetization pinned region 11a and the magnetization free region 12. This state corresponds to the "1" state defined in FIG. 2B. In this way, the write of "1" can be carried out.

Also, in the "1" state defined in FIG. 2B, the current is introduced in a direction indicated by an arrow Iwrite in FIG. 4B. At this time, in the first magnetization free layer 10, the conduction electrons are supplied from the first magnetization pinned region 11a through the magnetization free region 12 to the first magnetization pinned region 11a. At this time, the spin transfer torque (STT) acts against the magnetic domain wall DW formed on the boundary between the second magnetization pinned region 11b and the magnetization free region 12, and the conduction electrons are moved to a positive direction of the x-axis. That is, the current driven magnetic domain wall motion phenomenon is induced. Here, the write current is decreased in the positive direction of the x-axis, as compared with the boundary between the second magnetization pinned region 11b and the magnetization free region 12. Thus, the magnetic domain wall DW is stopped in the boundary between the second magnetization pinned region 11b and the magnetization free region 12. This state corresponds to the "0" state defined in FIG. 2A. In this way, the write of "0" can be carried out.

It should be noted that when the write of "0" in the "0" state and the write of "1" in the "1" state are carried out, the state is not changed. That is, overwrite is possible.

(Reading Method)

Figure 5A:
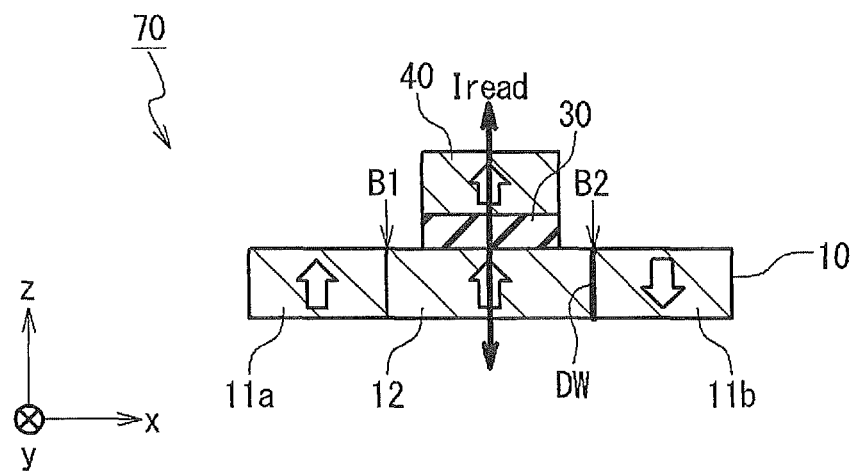
FIG. 5A shows a reading method.
Figure 5B:
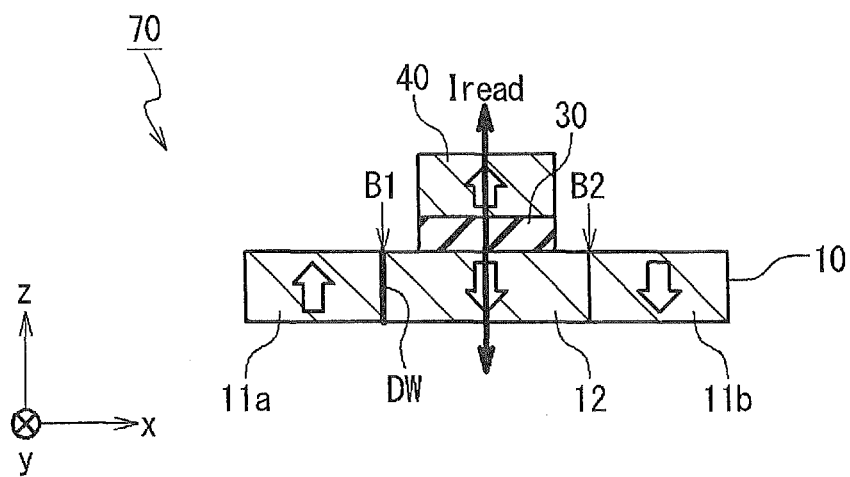
FIG. 5B shows the reading method.

The reading method of the data from the magnetic memory device according to this method will be described below. FIGS. 5A and 5B show the reading method of the data from the magnetic memory device that has the configuration shown in FIGS. 1A to 1D. In the above drawings, the illustration of the magnetization pinned layer 60 is omitted. In the present exemplary embodiment, a tunneling magneto-resistive effect (TMR effect) is mainly used to read the data. For this reason, a current Iread is introduced in a direction passing through a magnetic tunnel junction (MTJ), which is composed of the first magnetization free layer 10, the non-magnetic layer 30 and the reference layer 40. It should be noted that the direction of Iread is arbitrary.

Here, as shown in FIG. 5A, when the Iread is introduced in the "0" state defined in FIG. 2A, the magnetizations are parallel in the MTJ. Thus, a low resistance is attained. Also, as shown in FIG. 5B, when the Iread is introduced in the "1" state defined in FIG. 2B, the magnetizations are anti-parallel in the MTJ. Thus, a high resistance is attained. In this way, the data stored in the magnetic memory device can be detected as a difference between the resistance values.

(Circuit Configuration)

The circuit configuration for introducing the write current and the read current into a magnetic memory cell 80 having the magnetic memory device 70 according to the present exemplary embodiment will be described below.

Figure 6:
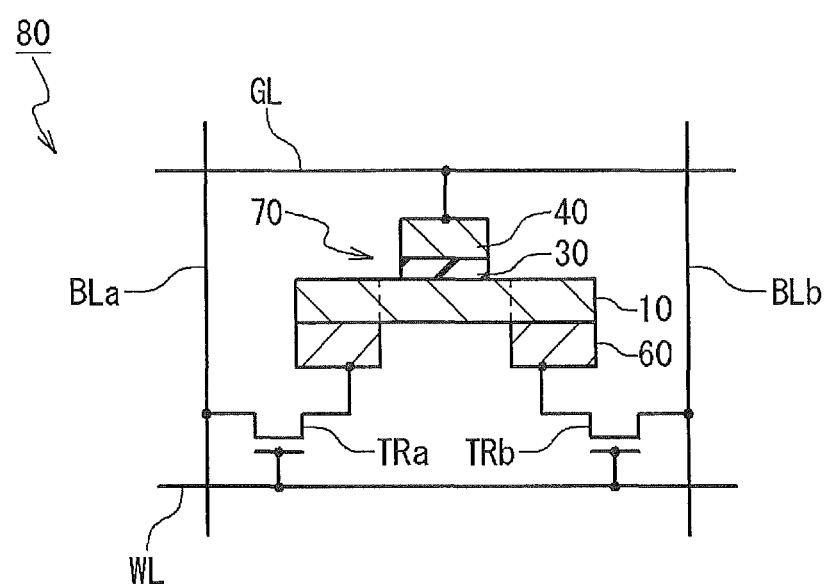
FIG. 6 shows a cell circuit diagram.

FIG. 6 shows a configuration example of a circuit corresponding to one bit of the magnetic memory cell 80. In an example shown in FIG. 6, the magnetic memory device 70 is the element of three terminals and connected to a word line WL, a ground line GL and a pair of bit lines s BLa, BLb. For example, the terminal connected to the reference layer 40 is connected to the ground line GL for reading. The terminal connected to the first magnetization pinned region 11a is connected to one of a source/drain of a transistor TRa, and the other of the source/drain is connected to the bit line BLa. The terminal connected to the second magnetization pinned region 11b is connected to one of a source/drain of a transistor TRb, and the other of the source/drain is connected to the bit line BLb. Gates of the transistors TRa, TRb are connected to the common word line WL. It should be noted that FIG. 6 shows the example in which the first magnetization pinned region 11a is connected through the first magnetization pinned layer 60a to the transistor TRa, and the second magnetization pinned region 11b is connected through the second magnetization pinned layer 60b to the transistor TRb.

At a time of writing data, the word line WL is set to a high level, and the transistors TRa and TRb are turned ON. Also, any one of the pair of bit lines BLa and BLb is set to the high level, and the other is set to a low level (ground level). As a result, the write current flows between the bit line BLa and the bit line BLb through the transistors TRa and TRb and the first magnetization free layer 10.

At a time of reading the data, the word line WL is set to the high level, and the transistors TRa and TRb are turned ON. Also, the bit line BLa is set to an open state, and the bit line BLb is set to the high level. As a result, the read current flows from the bit line BLb through the transistor TRb and the MTJ of the magnetic memory device 70 to the ground line GL. Consequently, the read operation that uses the magneto-resistive effect can be carried out.

Figure 7:
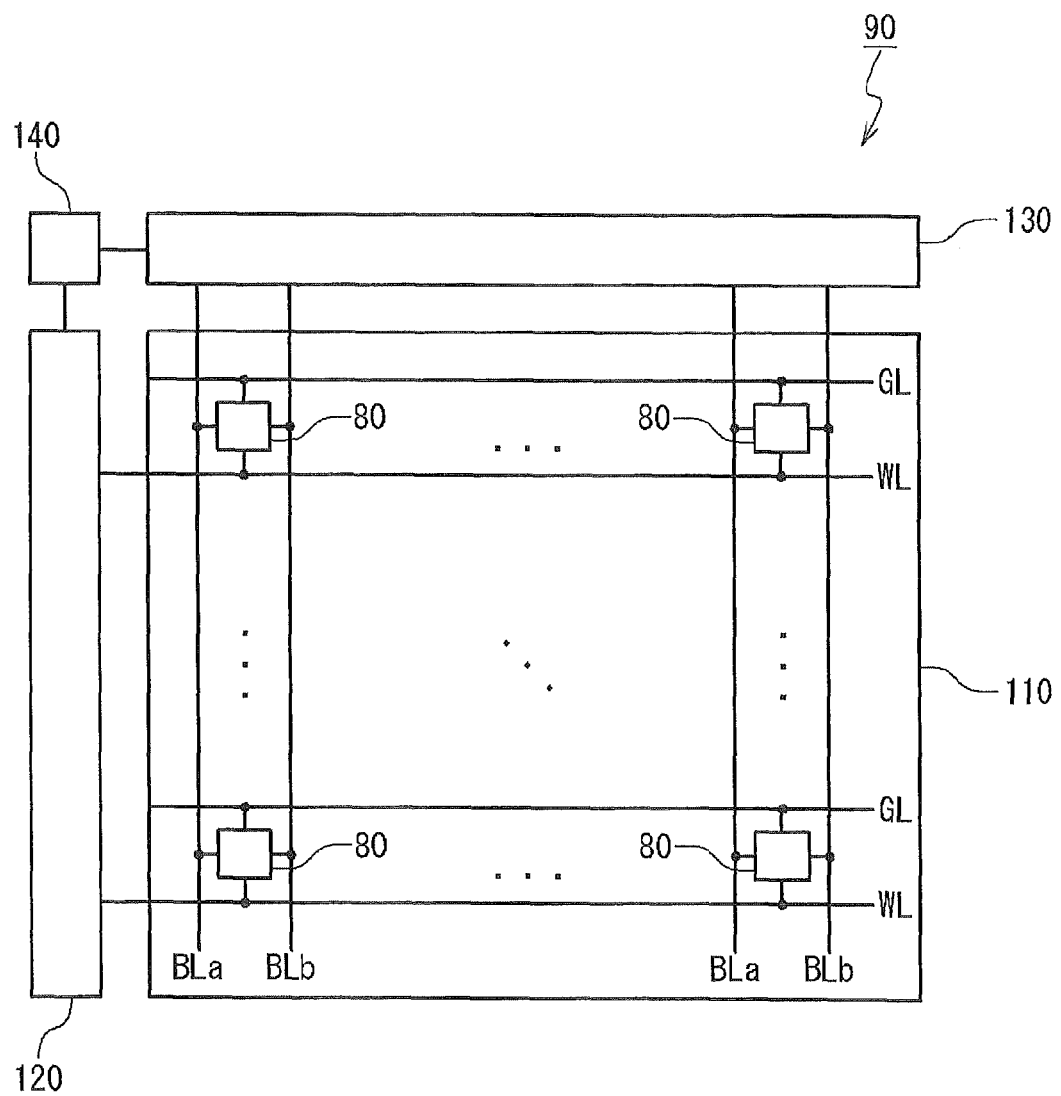
FIG. 7 shows a circuit block diagram.

FIG. 7 is a block diagram showing one example of the configuration of a magnetic memory 90 according to the example in the present exemplary embodiment. The magnetic memory 90 contains a memory cell array 110, an X driver 120, a Y driver 130 and a controller 140. The magnetic memory 90 contains the memory cell array 110, the X driver 120, the Y driver 130 and the controller 140. The memory cell array 110 has a plurality of magnetic memory cells 80 arranged in the shape of an array. Each of the magnetic memory cells 80 has the above magnetic memory device 70. As already shown in FIG. 6, each of the magnetic memory cells 80 is connected to the word line WL, the ground line GL and the pair of bit lines BLa and BLb. The X driver 120 is connected to a plurality of word lines WL and drives a selected word line connected to the magnetic memory cell 80 targeted for an access, among the plurality of word lines WL. The Y driver 130 is connected to a plurality of pairs of bit lines BLa and BLb and sets the respective bit lines to the states corresponding to the data write or data read. The controller 140 controls each of the X driver 120 and the Y driver 130 in response to the data write or data read.

(Manufacturing Method)

The manufacturing method of the magnetic memory device 70 according to the present exemplary embodiment will be described below with reference to FIGS. 8A to 8H and FIG. 9.

FIGS. 8A to 8H are sectional views that show a process of manufacturing the magnetic memory device 70 shown in FIGS. 1A to 1D. At first, a layer serving as the first magnetization pinned layer 60a is deposited on a substrate in which an electrode is embedded (the electrode is omitted in FIGS. 8A to 8H). This state corresponds to FIG. 8A. Next, the first magnetization pinned layer 60a is patterned. This state corresponds to FIG. 8B. Next, a layer serving as the second magnetization pinned layer 60b is deposited. This state corresponds to FIG. 8C. Next, the second magnetization pinned layer 60b is patterned. This state corresponds to FIG. 8D.

Figure 8A:
FIG. 8A shows a manufacturing method.
Figure 8B:
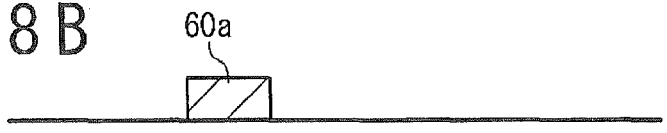
FIG. 8B shows the manufacturing method.
Figure 8C:
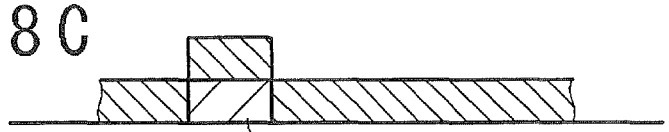
FIG. 8C shows the manufacturing method.
Figure 8D:
FIG. 8D shows the manufacturing method.
Figure 8E:
FIG. 8E shows the manufacturing method.
Figure 8F:
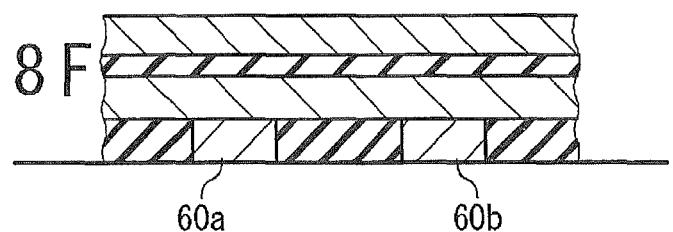
FIG. 8F shows the manufacturing method.
Figure 8G:
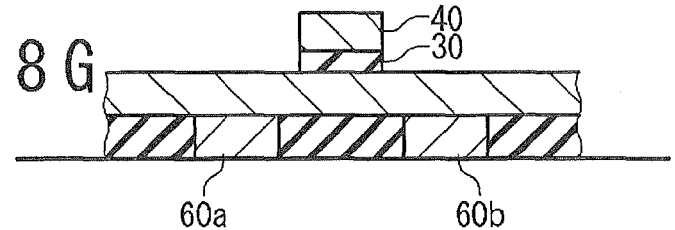
FIG. 8G shows the manufacturing method.
Figure 8H:
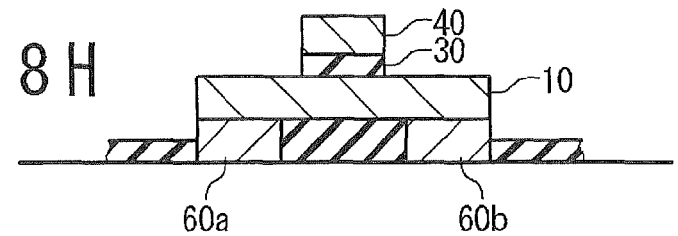
FIG. 8H shows the manufacturing method.

In succession, an insulating material is used to carry out an embedding operation, and the surfaces of the insulating material (inter-layer film), the first magnetization pinned layer 60a and the second magnetization pinned layer 60b are made flat. This state corresponds to FIG. 8E. Next, layers serving as the first magnetization free layer 10, the non-magnetic layer 30 and the reference layer 40 are deposited. This state corresponds to FIG. 8F. In succession, the reference layer 40 and the non-magnetic layer are patterned. This state corresponds to FIG. 8G. Finally, the first magnetization free layer 10 is patterned. At this time, the first magnetization pinned layer 60a and the second magnetization pinned layer 60b, which are located under it, are preferably patterned in the same shape. Consequently, the structure shown in FIG. 8H is completed. After that, the formation of an upper wiring layer and the like are required. However, since they depart from the scope of the present exemplary embodiment, their explanations are omitted here. Also, the manufacturing method described here indicates one example of manufacturing the magnetic memory device 70. Thus, this can be formed even by using a different method.

Figure 9:
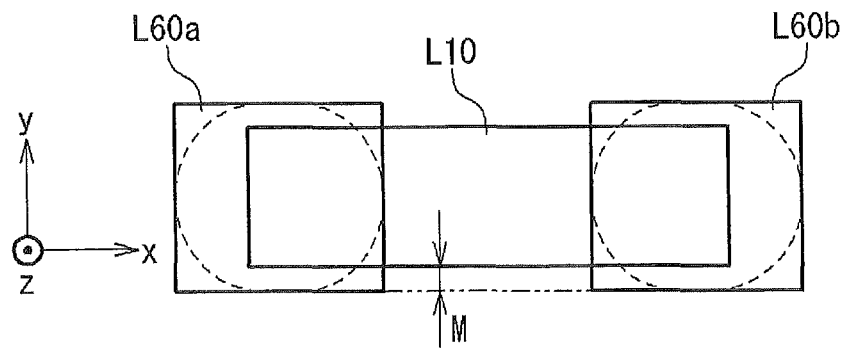
FIG. 9 shows a layout method.

It should be noted that one feature of the present exemplary embodiment is in that as mentioned above, the first boundary line B1 between the first magnetization pinned region 11a and the magnetization free region 12 has the first displacement D1 to the first vertical line N1, and the second boundary line B2 between the second magnetization pinned region 11b and the magnetization free region 12 has the second displacement D2 with respect to the second vertical line N2. Such displacements can be formed, for example, by the following procedures. At first, since the first boundary line B1 and the second boundary line B2 are defined by the shapes of the first magnetization pinned layer 60a and the second magnetization pinned layer 60b, the displacements can be formed by controlling the shapes of the first magnetization pinned layer 60a and the second magnetization pinned layer 60b. Specifically, at the steps of FIGS. 8B and 8D, a photo mask shown in FIG. 9 is used to carry out photo-lithography. In this way, the displacements can be formed.

In FIG. 9, a first magnetization pinned layer pattern L60a to form the first magnetization pinned layer L60 and a second magnetization pinned layer pattern L60b to form the second magnetization pinned layer 60b are designed larger than a first magnetization free layer pattern L10 to form the first magnetization free layer 10, by a margin M in a y-direction. At this time, in the photo lithography, blur of a similar size to a wavelength λ of a laser to be used is generated. When the first magnetization pinned layer 60a and the second magnetization pinned layer 60b are actually formed For the first magnetization pinned layer pattern L60a and the second magnetization pinned layer pattern L60b that are shown with solid lines, the layers 60a and 60b are shaped such that their corners are cut away, as indicated by dashed lines, respectively. Consequently, it is possible to generate the first boundary line B1 and the second boundary line B2 that have the displacements, respectively.

It should be noted that from the above principle, the margin M in FIG. 9 is preferable to be equal to or more than the wavelength λ of the laser used in the photo lithography. Also, the shape in which the corners are cut away as indicated by the dashed lines in FIG. 9 can be adjusted even by shifting a focus in the photo lithography from a just focus.

(Material)

The materials that can be used in the first magnetization free layer 10, the non-magnetic layer 30, the reference layer 40 and a magnetization pinned layer 60 will be described below.

Preferably, the first magnetization free layer 10 is made of the ferromagnetic material having the perpendicular magnetic anisotropy as mentioned above. Specifically, in addition to the alloy-based materials such as Fe—Pt alloy, Fe—Pd alloy, Co—Pt alloy, Co—Pd alloy, Tb—Fe—Co alloy, Gd—Fe—Co alloy, Tb—Fe alloy, Tb—Co alloy, Gd—Fe alloy, Gd—Co alloy, Co—Cr—Pt alloy, Co—Re—Pt alloy, Co—Ru—Pt alloy, and Co—W alloy, the alternatively stacked film such as Co/Pt stacked film, Co/Pd stacked film, Co/Ni stacked film, Co/Cu stacked film, Co/Ag stacked film, Co/Au stacked film, Fe/Pt stacked film, Fe/Pd stacked film, and Fe/Au stacked film are exemplified. In particular, the inventors experimentally confirmed that the Co/Ni stacked film among the above films can be used to attain the current driven magnetic domain wall motion whose control performance is high (refer to Non-Patent Literature 4). With regard to this aspect, the Co/Ni stacked film can be listed as the material preferable for the first magnetization free layer 10.

Preferably, the non-magnetic layer 30 is made of the insulating material. Specifically, Mg—O, Al—O, Al—N, Ti—O and the like are exemplified. The reference layer 40 is made of, for example, the ferromagnetic material having the perpendicular magnetic anisotropy. At this time, the material that can be used for the reference layer 40 overlaps with the material exemplified as the materials that can be used for the first magnetization free layer 10. Thus, their explanations are omitted. However, the reference layer 40 is preferred to be the ferromagnetic material as hard as possible because its magnetization is required to be stably fixed. With regard to this aspect, Fe—Pt alloy, Fe-Pd alloy, Co—Pt alloy, Co/Pt stacked film, the Co/Pd stacked film and the like are preferable. Also, its magnetization direction is required to be fixed to one direction. Moreover, the leakage magnetic field is preferred to be small. For this reason, as mentioned above, the stacked structure having the stacked ferry coupling is preferable. That is, the reference layer 40 is preferred to have the stacked configuration such as the ferromagnetic material/Ru/ ferromagnetic material. Also, the reference layer 40 may be made of the ferromagnetic material having an inter-surface magnetic anisotropy. In this case, it is possible to use all of the ferromagnetic materials. Typically, the Co-Fe can be listed. It should be noted that the exemplary embodiment in which the material having the in-surface magnetic anisotropy is used for the reference layer will be described later as a fourth modification example.

Also, the magnetization pinned layer 60 is made of the ferromagnetic material having the perpendicular magnetic anisotropy. The material that can be used in this case overlaps with the material that can be used in the first magnetization free layer 10. Thus, its description is omitted.

(Effect)

The effect obtained from the present exemplary embodiment will be described below. The present exemplary embodiment provides the reduction in the write current in the perpendicular magnetization magnetic domain wall motion MRAM. Its principle will be described below.

Figure 10:
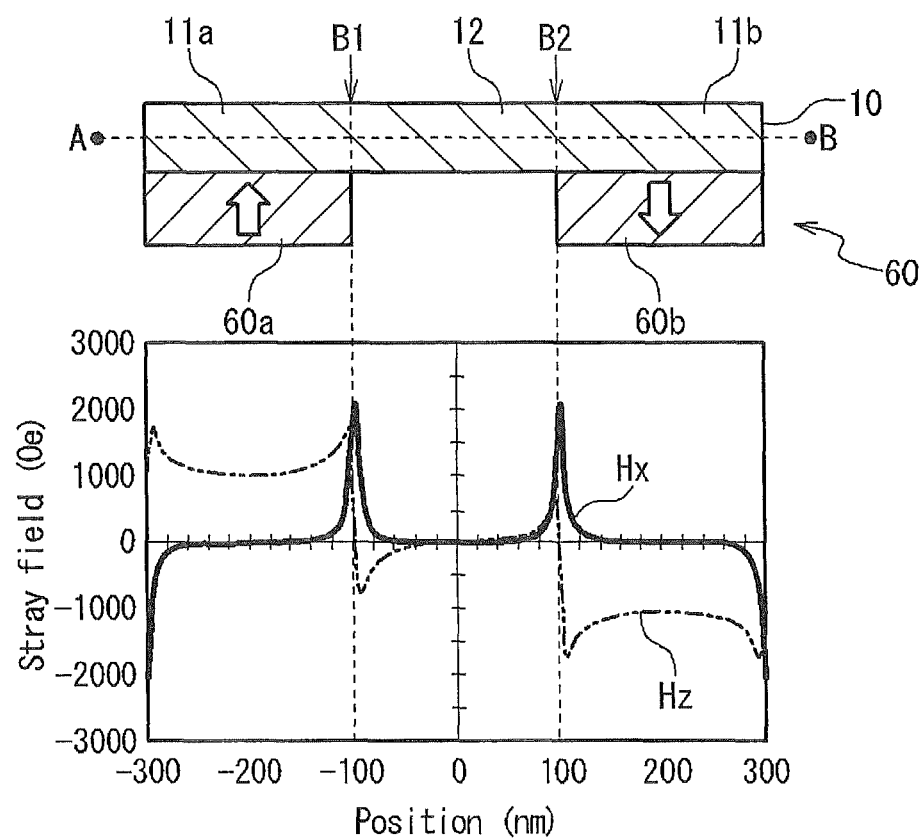
FIG. 10 shows a diagram schematically showing a subject in an exemplary embodiment of the present invention and a calculation result.

FIG. 10 shows a calculation result of the leakage magnetic field from the magnetization pinned layer 60 at a position (line A-B) of the first magnetization free layer 10, in the structure composed of the first magnetization free layer 10 and the magnetization pinned layer 60. It should be noted that a Co—Pt alloy film having the film thickness of 10 nm is assumed as the film of the magnetization pinned layer 60. As can be understood from the calculation result, the leakage magnetic field (Hz) of about 1000 Oe exists in a +z direction and a −z direction above the first magnetization pinned layer 60a and the second magnetization pinned layer 60b, respectively. Moreover, a relatively large leakage magnetic field (Hx) of 2000 Oe exists in the boundary between the first magnetization pinned region 11a and the magnetization free region 12, namely, in the vicinity of the first boundary line B1, and in the boundary between the second magnetization pinned region 11b and the magnetization free region 12, namely, in the vicinity of the second boundary line B2. The first boundary line B1 and the second boundary line B2 are the portions in which the magnetic domain wall is trapped. When the strong magnetic field (Hx) in the x-direction is applied to the magnetic domain wall, the current density required to de-pin the magnetic domain wall by the current is increased, which results in the increase in the write current.

Here, the inventors of the present application paid attention to the distribution of the magnetic field (Hx) in the x direction in the vicinities of the first boundary line B1 and the second boundary line B2 and the structure of the generated magnetic domain wall. At first, as can be understood from FIG. 10, the leakage magnetic field (Hx) in the x direction has a very sharp peak in the vicinities of the first boundary line B1 and the second boundary line B2. At a position away from the peak position by the distance of 10 nm, its value is understood to be reduced to about ⅟10. Thus, when the position at which the magnetic domain wall is generated is separated from the peak position of the Hx by about 10 nm, the de-pin can be understood to be carried out by the current without any substantial influence of this leakage magnetic field.

Figure 11A:
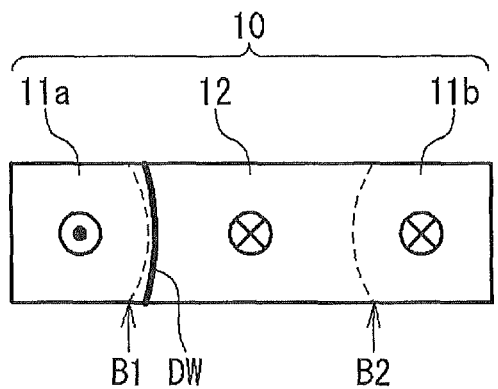
FIG. 11A shows a plan view showing an action and an effect in the exemplary embodiment of the present invention.

It should be noted that as mentioned above, the structure of the magnetic domain wall generated when the first boundary line B1 and the second boundary line B2 have the displacements is shown by a bold line in FIG. 11A. The magnetic domain wall is advantageous from the viewpoint of exchange energy when the area of the magnetic domain wall is generated as small as possible. For this reason, as shown in FIG. 11A, when the magnetic domain wall is generated in the vicinity of the first boundary line B1, the magnetic domain wall is not perfectly along the first boundary line B1. At this time, a part of the magnetic domain wall exists in a position away from the first boundary line B1. That is, a gap region is formed between a part of the magnetic domain wall DW and the first boundary line Bl. In an example of FIG. 11A, the gap region is formed at both ends (the ends in the ±y directions) of the first magnetization free layer 10.

Figure 11B:
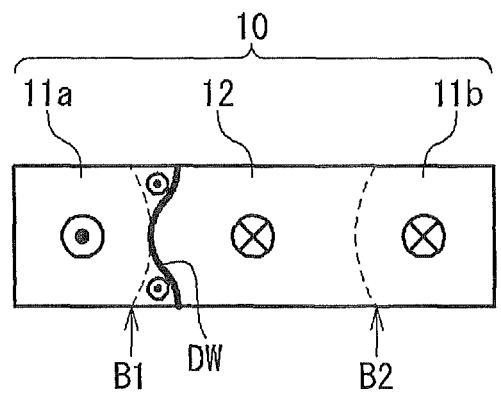
FIG. 11B shows a plan view showing the action and the effect in the exemplary embodiment of the present invention.
Figure 11C:
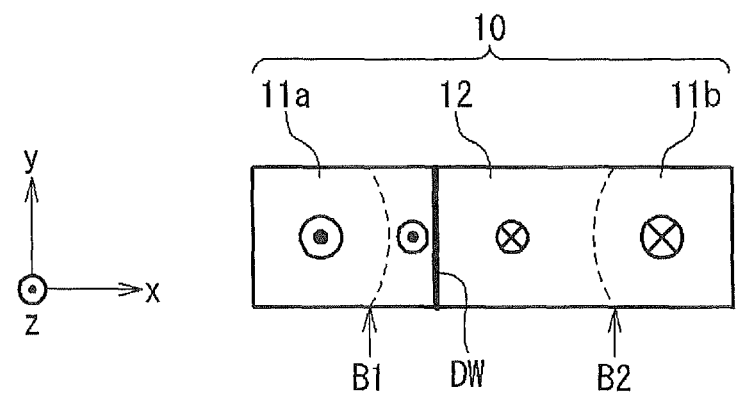
FIG. 11C shows a plan view showing the action and the effect in the exemplary embodiment of the present invention.

Such a region is located away from the first boundary line B1. Thus, it becomes very difficult to receive the influence of the leakage magnetic field (Hx) in the x direction from the magnetization pinned layer 60, as mentioned above. Therefore, when the write current is introduced, the region having the gap from the first boundary line B1 is firstly de-pinned as shown in FIG. 11B. When the state shown in FIG. 11B is generated, a Bloch line is formed inside the magnetic domain wall. In association with the formation of the Bloch line, the pinned region until that time is also de-pinned (the central portion of the magnetic domain wall in FIG. 11B). In this way, the magnetic domain wall can be de-pinned as shown in FIG. 11C, even by the extremely small current, as compared with a case in which the first boundary line B1 does not have the displacement D.

It should be noted that the present exemplary embodiment is especially effective when a saturation magnetization (Ms) of the ferromagnetic material used as the magnetization pinned layer 60 is strong or when the film thickness (t) is thick. Thus, for example, in the first magnetization pinned layer 60a and the second magnetization pinned layer 60b, when only the first magnetization pinned layer 60a is strong in the saturation magnetization (Ms) or thick in the film thickness (t), it can be understood that only the first boundary line B1 may be formed to have the first displacement Dl to the first vertical line N1, and the second boundary line B2 may be formed to overlap with the second vertical line N2.

MODIFICATION EXAMPLES

The magnetic memory device 70 as described above can be formed even by using modification examples as described below.

First Modification Example

Figure 12A:
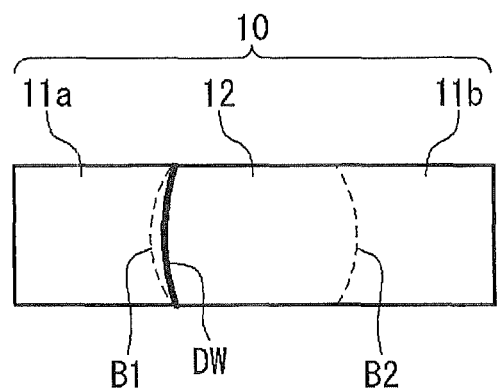
FIG. 12A shows a first modification example.
Figure 12B:
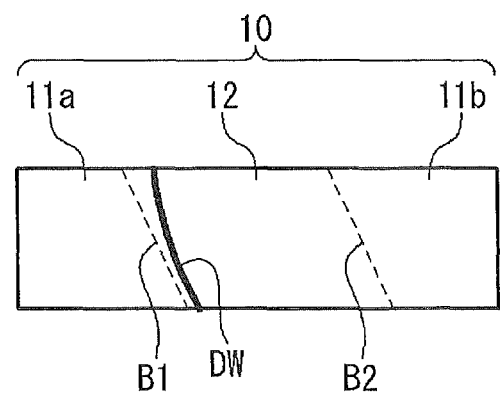
FIG. 12B shows the first modification example.
Figure 12C:
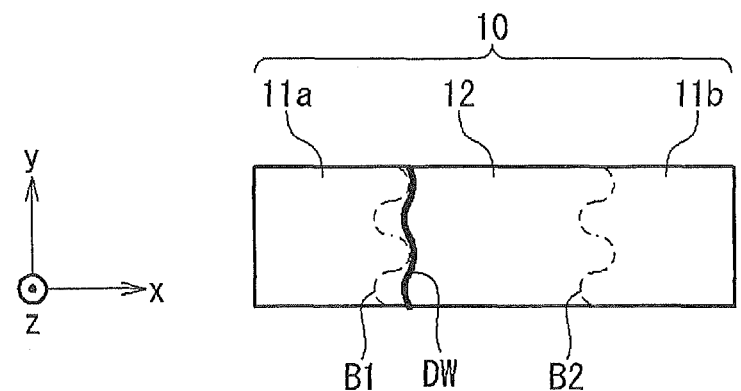
FIG. 12C shows the first modification example.

FIGS. 12A to 12C show the structure of a first modification example of the magnetic memory device 70 according to the present exemplary embodiment. The first modification example relates to the shapes of the first boundary line B1 and the second boundary line B2.

In the present exemplary embodiment, the first boundary line B1 and the second boundary line B2 have the first displacement D1 and the second displacement D2 to the first vertical line N1 and the second vertical line N2, respectively. As the shapes of the first boundary line B1 and the second boundary line B2 as mentioned above, the curves that are convex in the inside direction are exemplified in the drawings illustrated until now (for example, FIGS. 1A, 1C and 1D).

However, the shapes of the first boundary line B1 and the second boundary line B2 are actually arbitrary. FIGS. 12A to 12C are x-y plan views showing their specific examples.

For example, the first boundary line B1 and the second boundary line B2 may be generated to be convex in the outside direction, as shown in FIG. 12A. Also, as shown in FIG. 12B, the first and second boundary lines B1 and B2 may be generated to be oblique with respect to the first vertical line N1 and the second vertical line N2 (which are not shown). Also, as shown in FIG. 12C, the first and second boundary lines B1 and B2 may be generated to have the concave and convex portions. The structures of the magnetic domain walls DW that are expected to be generated in the vicinity of the first boundary line B1 in the respective cases are indicated by bold lines in FIGS. 12A to 12C. In all the cases, the gap is formed between it and the first boundary line B1. Consequently, the de-pin at the low current can be carried out, as described with respect to FIGS. 11A to 11C.

Second Modification Example

Figure 13A:
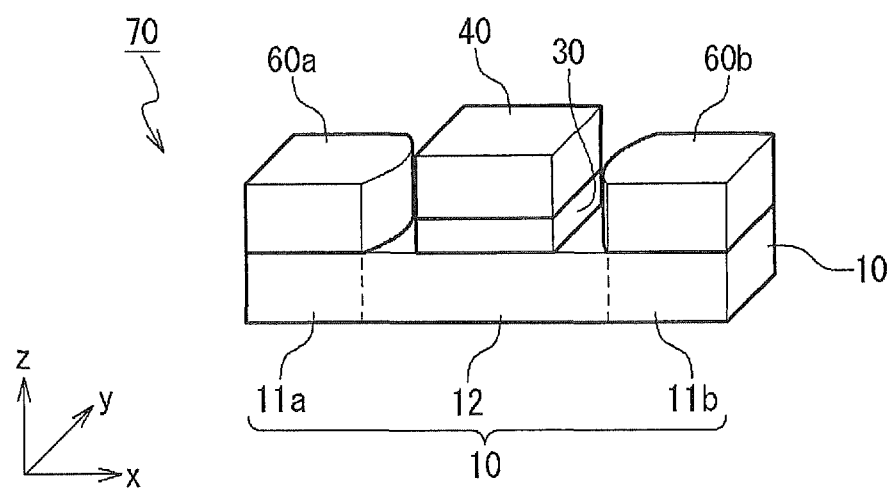
FIG. 13A shows a second modification example.
Figure 13B:
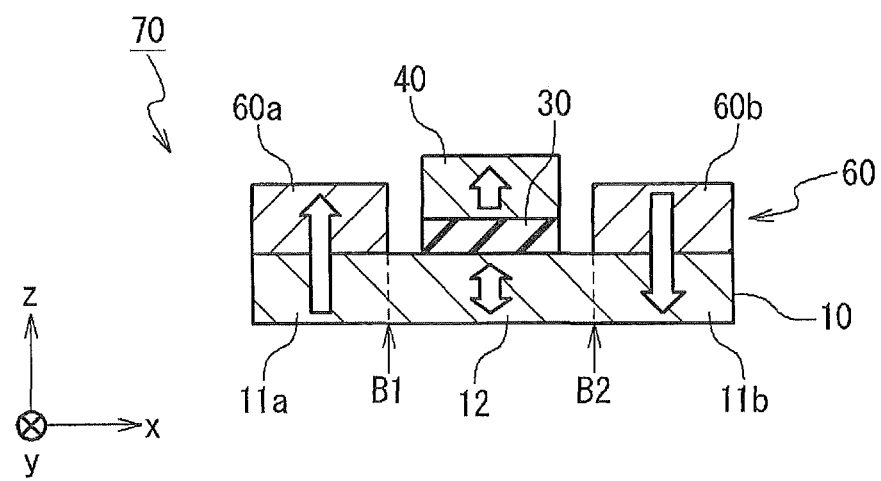
FIG. 13B shows the second modification example.

FIGS. 13A and 13B show the structure of the second modification example of the magnetic memory device 70 according to the present exemplary embodiment. The second modification example relates to the position of the magnetization pinned layer 60.

In the present exemplary embodiment, the magnetization pinned layer 60 is provided to fix the magnetizations of the first magnetization pinned region 11a and the second magnetization pinned region 11b in the state that they are oriented in the anti-parallel direction. The previous drawings show that the magnetization pinned layer 60 is formed on the substrate side (−z direction) with respect to the first magnetization free layer 10. However, this position is arbitrary. FIGS. 13A and 13B show one modification example with regard to the arbitrary property of the position of the magnetization pinned layer 60.

In FIGS. 13A and 13B, the magnetization pinned layer 60 is arranged on the side (+z direction) opposite to the substrate with respect to the first magnetization free layer 10. In detail, the first magnetization pinned layer 60a is provided on the upper side of the first magnetization pinned region 11a, and the second magnetization pinned layer 60b is provided on the upper side of the second magnetization pinned region 11b. In this way, in the present exemplary embodiment, it is enough if the above conditions may be satisfied with regard to the first boundary line B1 and the first vertical line N1. Thus, the position of the magnetization pinned layer 60 is arbitrary.

Third Modification Example

FIGS. 14A to 14C and FIGS. 15A and 15B show the structures of the third modification example of the magnetic memory device 70 according to the present exemplary embodiment. The third modification example relates to the number of the magnetization pinned layers 60.

In the present exemplary embodiment, the magnetization pinned layer 60 is provided to fix the magnetizations of the first magnetization pinned region 11a and the second magnetization pinned region 11b in the state that they are oriented in the anti-parallel direction. In the previous drawings, the magnetization pinned layer 60 is composed of the first magnetization pinned layer 60a and the second magnetization pinned layer 60b, and the first magnetization pinned layer 60a is magnetically coupled to the first magnetization pinned region 11a, and the second magnetization pinned layer 60b is magnetically coupled to the second magnetization pinned region 11b. However, the number of the magnetization pinned layers 60 is arbitrary. FIGS. 14A to 14C and FIGS. 15A and 15B show the modification examples with regard to the arbitrary property of the number of the magnetization pinned layers 60.

Figure 14A:
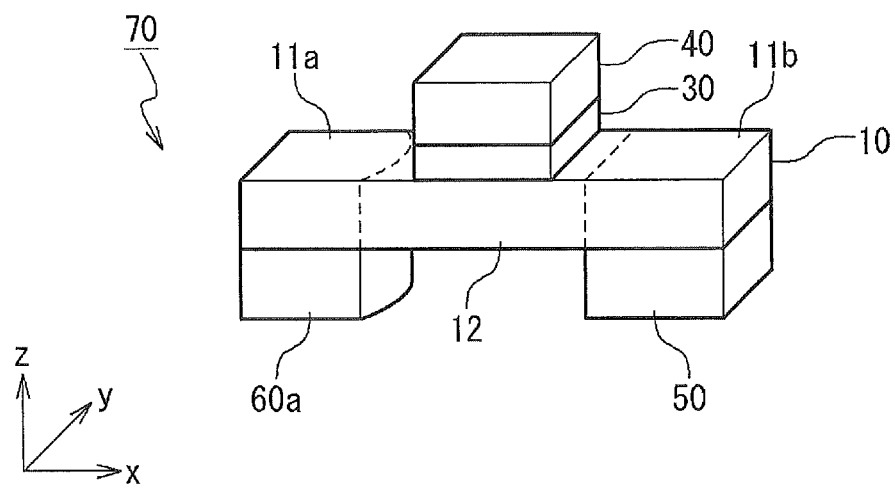
FIG. 14A shows a third modification example.
Figure 14B:
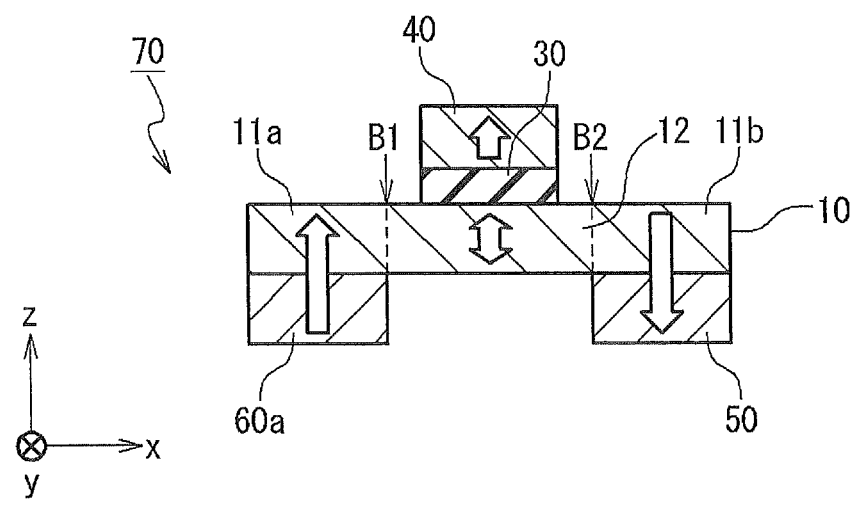
FIG. 14B shows the third modification example.
Figure 14C:
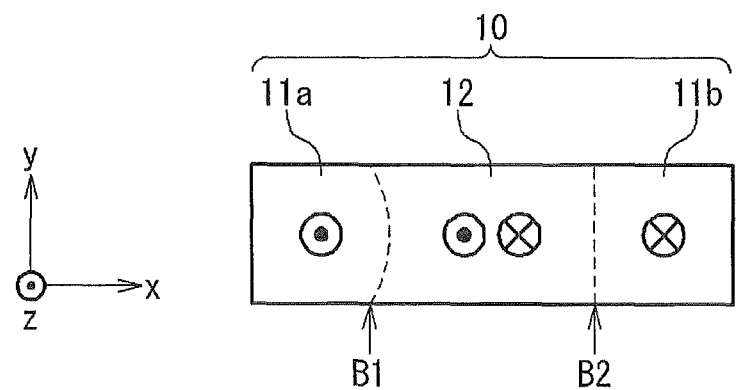
FIG. 14C shows the third modification example.

In FIGS. 14A to 14C, the magnetization pinned layer 60 is composed of only the first magnetization pinned layer 60a magnetically coupled to the first magnetization pinned region 11a, and the first magnetization pinned layer 60a is connected to the lower side of the first magnetization pinned region 11a, and an electrically conductive layer 50 is connected to the lower side of the second magnetization pinned region 11b. The electrically conductive layer 50 is made of non-magnetic metal.

Even in such a configuration, it is possible to carry out the introduction of the single magnetic domain wall into the first magnetization free layer 10, namely, the so-called initialization. Also, in this case, the second boundary line B2 is defined by a curve that intersects the first magnetization free layer 10, of the outer circumferential line of the electrically conductive layer 50. In this case, since the electrically conductive layer 50 is made of the non-magnetic material, the second boundary line B2 is not required to be generated to have the second displacement D2 (that is not shown in FIGS. 14A to 14C), with respect to the second vertical line N2 (that is not shown in FIGS. 14A to 14C).

Figure 15A:
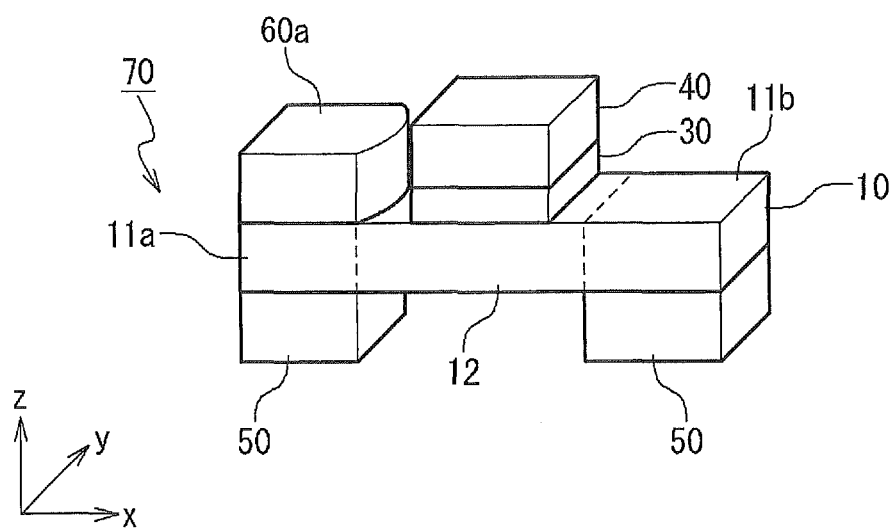
FIG. 15A shows the third modification example (No. 2)
Figure 15B:
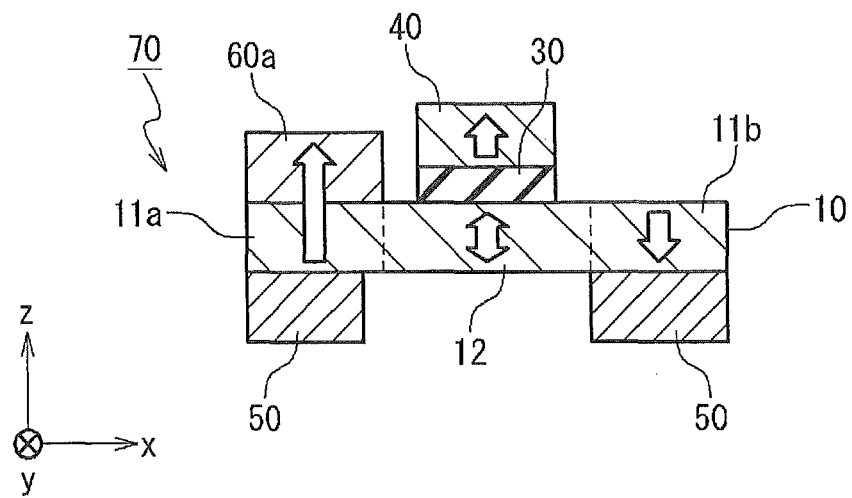
FIG. 15B shows the third modification example (No. 2)
Figure 16A:
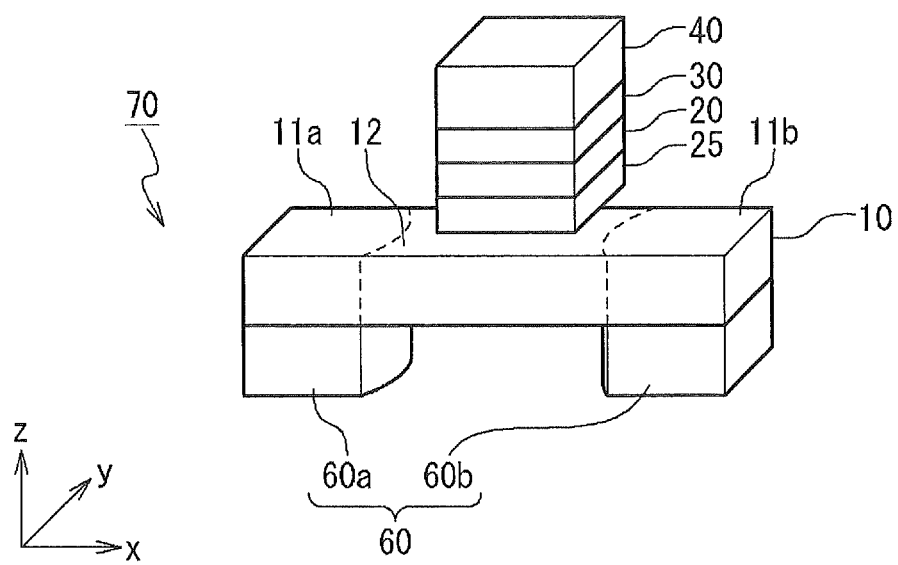
FIG. 16A shows a fourth modification example.
Figure 16B:
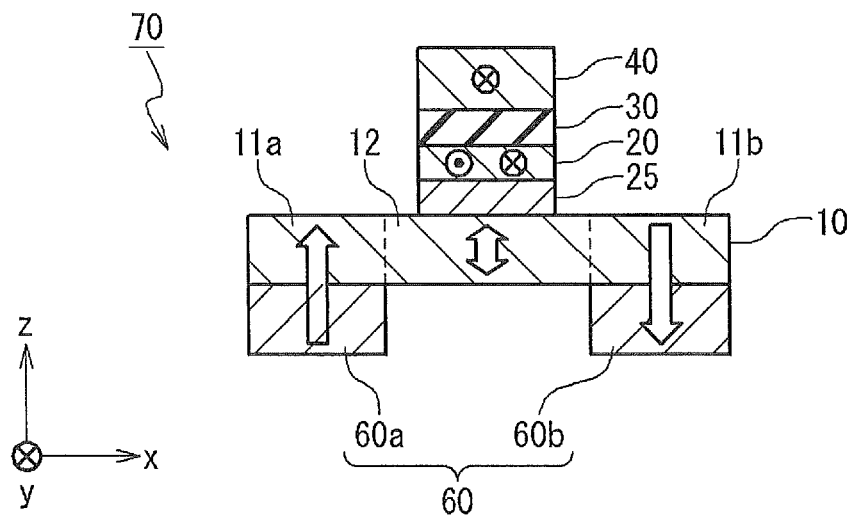
FIG. 16B shows the fourth modification example.
Figure 16C:
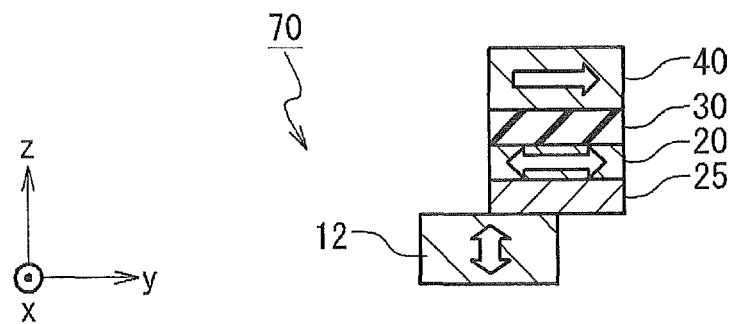
FIG. 16C shows the fourth modification example.
Figure 16D:
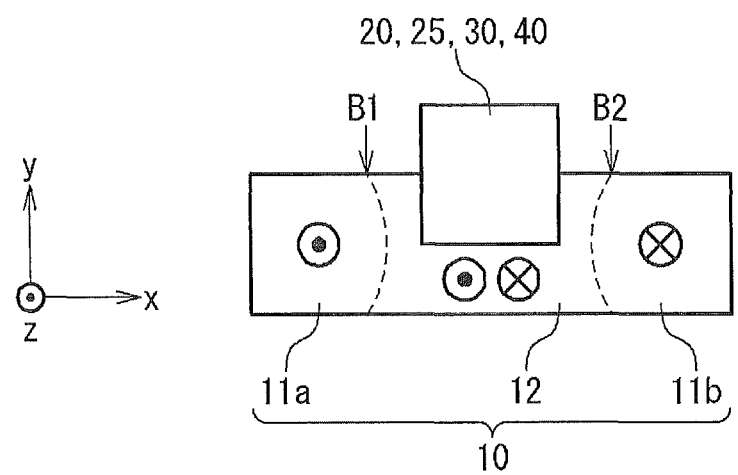
FIG. 16D shows the fourth modification example.

Also, in FIGS. 15A and 15B, the magnetization pinned layer 60 is composed of only the first magnetization pinned layer 60a magnetically coupled to the first magnetization pinned region 11a, similarly to FIGS. 14A to 14C, and the first magnetization pinned layer 60a is magnetically coupled to the upper side of the first magnetization pinned region 11a. Also, the first magnetization pinned region 11a and the second magnetization pinned region 11b are adjacent to the electrically conductive layer 50 at the lower surface so as to be connected to lower wirings and transistors. Even in such a structure, the present invention can be embodied.

Fourth Modification Example

FIGS. 16A to 16D show the structure of the fourth modification example of the magnetic memory device 70 according to the present exemplary embodiment. The fourth modification example relates to the reading method.

In the present exemplary embodiment, the non-magnetic layer 30 and the reference layer 40 are provided to read the data from the first magnetization free layer 10 serving as an data storing layer. In the previous description, the non-magnetic layer 30 and the reference layer 40 are provided adjacently to the first magnetization free layer 10. The fourth modification example relates to another reading type.

In the fourth modification example, a second magnetization free layer 20 is newly provided.

Moreover, a contact layer 25 is preferred to be provided. Also, the second magnetization free layer 20, the non-magnetic layer 30 and the reference layer 40 are provided adjacently in this order, and the magnetic tunnel junction (MTJ) is produced by them. Also, preferably, the gravity center (geometric gravity center) of the second magnetization free layer 20 is provided to be away from the gravity center of the magnetization free region 12 of the first magnetization free layer 10, in an x-y plane. Here, this shifted direction is defined as a first direction.

Each of the second magnetization free layer 20 and the reference layer 40 is made of the ferromagnetic material having the magnetic anisotropy in the in-surface direction. Also, the direction of the magnetic anisotropy of the second magnetization free layer 20 is arbitrary in the in-surface direction. On the other hand, the magnetization of the reference layer 40 is substantially fixed to one direction. This direction is desired to be parallel to the first direction. FIGS. 13A and 13B show an example that the first direction is the y direction, namely, the direction vertical to the longitudinal direction of the first magnetization free layer 10. However, this first direction is arbitrary. For example, this may be the x direction.

According to this modification example, the data stored in the magnetization direction of the vertical direction of the magnetization free region 12 can be read by the MTJ having the in-surface magnetization, which is composed of the second magnetization free layer 20, the non-magnetic layer 30 and the reference layer 40. For example, in the "0" state that the magnetization free region 12 is upwardly magnetized, the magnetization of the second magnetization free layer 20 is oriented to the positive direction of the y-axis by a leakage magnetic flux that is generated by the upward magnetization of the magnetization free region 12. This is because the second magnetization free layer 20 is arranged on the upper side (the positive direction of a z-axis) of the magnetization free region 12, and the gravity center of the second magnetization free layer 20 is provided to be shifted in the positive direction of the y-axis with respect to the magnetization free region 12. Consequently, the magnetizations of the second magnetization free layer 20 and the reference layer 40 are made parallel, and this MTJ becomes the state of a low resistance.

On the other hand, in the "1" state that the magnetization free region 12 is downwardly magnetized, the magnetization of the second magnetization free layer 20 is oriented to the negative direction of the y-axis by the leakage magnetic flux that is generated by the downward magnetization of the magnetization free region 12. Consequently, the magnetizations of the second magnetization free layer 20 and the reference layer 40 are made anti-parallel. Thus, this MTJ becomes the state of a high resistance. Consequently, the data stored as the magnetization of the vertical direction of the magnetization free region 12 is transferred to the magnetization of the second magnetization free layer 20 having the in-surface magnetization and can be read by the MTJ configured by the in-surface magnetization.

In the MTJ configured by the in-surface magnetization, it is possible to obtain a magnetic resistance effect ratio (MR ratio) that is typically high. Consequently, it is possible to obtain a large read signal.

Each of the second magnetization free layer 20 and the reference layer 40 is made of the material having the magnetic anisotropy in the in-surface direction. Specifically, Co—Fe—B and the like are exemplified. Also, the non-magnetic layer 30 is preferred to be made of a non-magnetic material. Specifically, Mg—O and the like are exemplified.

[Industrial Applicability]

As the utilization example of the present invention, it is possible to list a non-volatile semiconductor memory that is used in a mobile personal computer and PDA, and a microcomputer having a built-in non-volatile memory that is used in a car and the like. Also, the present invention can be applied to a large scale of a storage device such as a race track memory and the like.

The invention claimed is:

1. A magnetic memory device comprising a first magnetization free layer, a non-magnetic layer, a reference layer and a magnetization pinned layer,
wherein said first magnetization free layer comprises ferromagnetic material having perpendicular magnetic anisotropy, and said first magnetization free layer comprises a first magnetization pinned region, a second magnetization pinned region and a magnetization free region,
wherein said magnetization pinned layer comprises said first magnetization pinned layer magnetically coupled with said first magnetization pinned region at least, and
wherein a first displacement is present between a first boundary line and a first vertical line, where a curve portion, which crosses said first magnetization free layer, of an outer circumferential line of said first magnetization pinned layer is said first boundary line, a segment which links a center of said magnetization free region and a center of said first magnetization pinned region is a first segment, and a segment, which is a vertical line of the first segment, and which comes in contact with the first boundary line is said first vertical line.

2. The magnetic memory device according to claim 1, wherein said magnetization pinned layer further comprises a second magnetization pinned layer magnetically coupled with said second magnetization pinned region, and
wherein a second displacement is present between a second boundary line and a second vertical line, where a curve portion, which crosses said first magnetization free layer, of an outer circumferential line of said second magnetization pinned layer is a second boundary line, a segment which links the center of said magnetization free region and the center of said second magnetization pinned region is a second segment, and a segment, which is a vertical line of said second segment and which comes in contact with the second boundary line is said second vertical line.

3. The magnetic memory device according to claim 1, wherein at least one of the first displacement and the second displacement is equal to or more than 5 nm.

4. The magnetic memory device according to claim 1, wherein at least one of the first boundary line and the second boundary line has any of a convex portion, a concave portion, and a convex and concave portion in a substrate parallel plane.

5. The magnetic memory device according to claim 1, wherein at least one of the first boundary line and the second boundary line crosses diagonally to the first vertical line and the second vertical line, respectively.

6. The magnetic memory device according to claim 1, wherein said non-magnetic layer is provided to neighbor said magnetization free region, said reference layer is provided on an opposite side to said magnetization free region to neighbor said non-magnetic layer, and said reference layer comprises a ferromagnetic material having perpendicular magnetic anisotropy.

7. The magnetic memory device according to claim 1, further comprising a second magnetization free layer,
wherein said non-magnetic layer is provided to neighbor said second magnetization free layer, said reference layer is provided on a side opposite to said second magnetization free layer to neighbor said non-magnetic layer,
wherein said second magnetization free layer is provided to shift in a first direction to said magnetization free region in the substrate parallel plane, and said second magnetization free layer and said reference layer comprises ferromagnetic materials having in-plane magnetic anisotropy, and
wherein said reference layer has magnetization pinned in substantially parallel direction to the first direction.

8. A magnetic memory comprising a magnetic memory device comprising a first magnetization free layer, a non-magnetic layer, a reference layer and a magnetization pinned layer, wherein said first magnetization free layer comprises ferromagnetic material having perpendicular magnetic anisotropy, and said first magnetization free layer comprises a first magnetization pinned region, a second magnetization pinned region and a magnetization free region, wherein said magnetization pinned layer comprises said first magnetization pinned layer magnetically coupled with said first magnetization pinned region at least, and wherein a first displacement is present between a first boundary line and a first vertical line, where a curve portion, which crosses said first magnetization free layer, of an outer circumferential line of said first magnetization pinned layer is said first boundary line, a segment which links a center of said magnetization free region and a center of said first magnetization pinned region is a first segment, and a segment, which is a vertical line of the first segment, and which comes in contact with the first boundary line is said first vertical line.

9. The magnetic memory according to claim 8, wherein said magnetization pinned layer further comprises a second magnetization pinned layer magnetically coupled with said second magnetization pinned region, and wherein a second displacement is present between a second boundary line and a second vertical line, where a curve portion, which crosses said first magnetization free layer, of an outer circumferential line of said second magnetization pinned layer is a second boundary line, a segment which links the center of said magnetization free region and the center of said second magnetization pinned region is a second segment, and a segment, which is a vertical line of said second segment and which comes in contact with the second boundary line is said second vertical line.

10. The magnetic memory device according to claim 8, wherein at least one of the first displacement and the second displacement is equal to or more than 5 nm.

11. The magnetic memory device according to claim 8, wherein at least one of the first boundary line and the second boundary line has any of a convex portion, a concave portion, and a convex and concave portion in a substrate parallel plane.

12. The magnetic memory device according to claim 8, wherein at least one of the first boundary line and the second boundary line crosses diagonally to the first vertical line and the second vertical line, respectively.

13. The magnetic memory device according to claim 8, wherein said non-magnetic layer is provided to neighbor said magnetization free region, said reference layer is provided on an opposite side to said magnetization free region to neighbor said non-magnetic layer, and said reference layer comprises a ferromagnetic material having perpendicular magnetic anisotropy.

14. The magnetic memory device according to claim 8, further comprising a second magnetization free layer, wherein said non-magnetic layer is provided to neighbor said second magnetization free layer, said reference layer is provided on a side opposite to said second magnetization free layer to neighbor said non-magnetic layer, wherein said second magnetization free layer is provided to shift in a first direction to said magnetization free region in the substrate parallel plane, and said second magnetization free layer and said reference layer comprises ferromagnetic materials having in-plane magnetic anisotropy, and wherein said reference layer has magnetization pinned in substantially parallel direction to the first direction.

* * * * *